(12) United States Patent
Horikoshi et al.

(10) Patent No.: US 8,492,695 B2
(45) Date of Patent: Jul. 23, 2013

(54) SOLID-STATE IMAGE PICKUP APPARATUS HAVING IMPROVED SPECTRAL BALANCE

(75) Inventors: Hiroshi Horikoshi, Kumamoto (JP); Koji Kikuchi, Kanagawa (JP); Tomohiro Yamazaki, Kanagawa (JP)

(73) Assignee: Sony Corporation (JP)

( * ) Notice: Subject to any disclaimer, the term of this patent is extended or adjusted under 35 U.S.C. 154(b) by 589 days.

(21) Appl. No.: 12/660,728

(22) Filed: Mar. 3, 2010

(65) Prior Publication Data

US 2010/0230578 A1    Sep. 16, 2010

(30) Foreign Application Priority Data

Mar. 12, 2009    (JP) ................................. P2009-058985

(51) Int. Cl.
*H01L 27/00* (2006.01)
*H01L 31/0232* (2006.01)

(52) U.S. Cl.
USPC ........................................ 250/208.1; 257/432

(58) Field of Classification Search
USPC ......... 250/208.1, 216, 226; 257/432; 348/273
See application file for complete search history.

(56) References Cited

U.S. PATENT DOCUMENTS

| 6,858,828 B2 * | 2/2005 | Roy et al. ................... 250/208.1 |
| 7,531,884 B2 | 5/2009 | Kim |
| 2007/0155083 A1 * | 7/2007 | Park ............................. 438/199 |

FOREIGN PATENT DOCUMENTS

| JP | 04099379 A | * | 3/1992 |
| JP | 2003-224249 A |  | 8/2003 |
| JP | 2006-190766 A |  | 7/2006 |
| JP | 2007-184603 A |  | 7/2007 |

* cited by examiner

*Primary Examiner* — Thanh Luu
(74) *Attorney, Agent, or Firm* — Lerner, David, Littenberg, Krumholz & Mentlik, LLP

(57) ABSTRACT

A solid-state image pickup apparatus includes a substrate, a wiring layer, and a waveguide. The substrate is provided with a pixel array portion constituted of a plurality of pixels each having a photoelectric converter that converts incident light into an electrical signal. The wiring layer includes a plurality of wirings and an insulating layer that covers the plurality of wirings that are laminated above the substrate. The waveguide guides light to each of the photoelectric converters of the plurality of pixels, the waveguide being formed in the wiring layer. The waveguide is formed to have a waveguide exit end from which light exits the waveguide so that a distance between the waveguide exit end and a surface of the photoelectric converter that receives light from the waveguide become shorter, as wavelengths of light guided by the waveguide are longer.

7 Claims, 16 Drawing Sheets

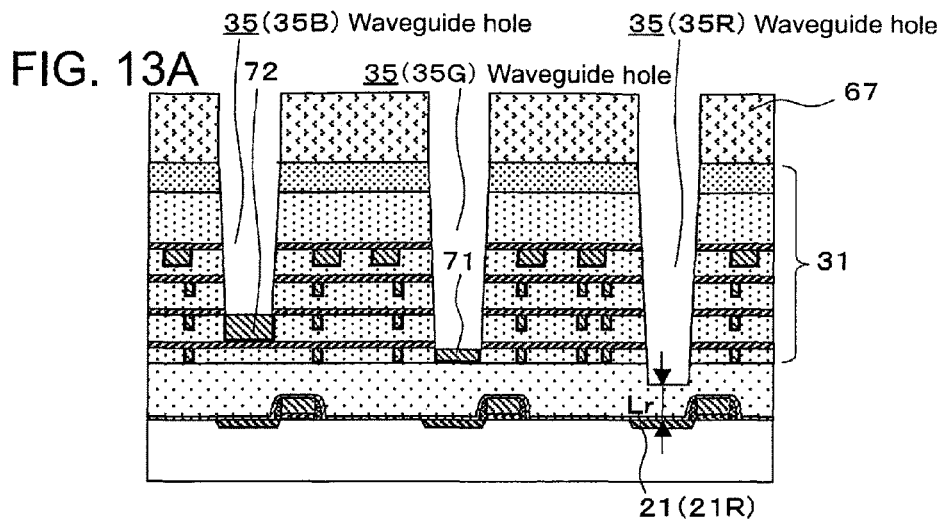
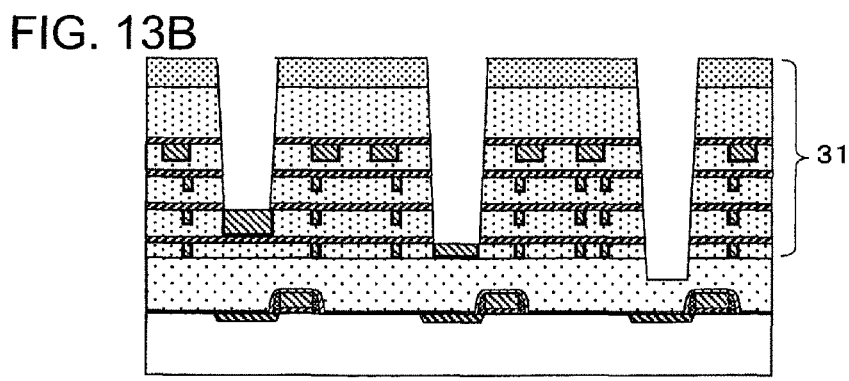
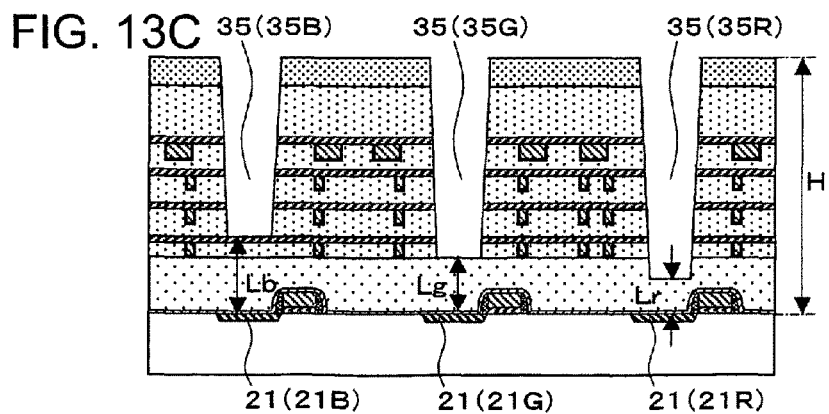

SOLID-STATE IMAGE PICKUP APPARATUS HAVING IMPROVED SPECTRAL BALANCE

CROSS-REFERENCE TO RELATED APPLICATION

The present application claims priority from Japanese Patent Application No. JP 2009-058985 filed in the Japanese Patent Office on Mar. 12, 2009, the entire content of which is incorporated herein by reference.

BACKGROUND OF THE INVENTION

1. Field of the Invention

The present invention relates to a solid-state image pickup apparatus, a method of manufacturing the same, and an image pickup apparatus.

2. Description of the Related Art

In response to the progress of the increase in number of pixels and the miniaturization of a pixel size, there has been proposed a technique of using a waveguide structure as a means for increasing a light collection efficiency of each pixel in a solid-state image sensor. In particular, in a CMOS image sensor, for forming a metal wiring on a light incident side of a photodiode, a waveguide structure, which guides incident light to a photodiode while confining the light and avoiding the metal wiring, is becoming a necessary technique.

A description will be given on an example of a solid-state image sensor having a waveguide structure in related art.

In a solid-state image sensor in related art, a photodiode that functions as a photoelectric converter is formed in an area separated by an element-separation insulating film or the like formed on a silicon substrate. On an upper surface of the silicon substrate adjacent to the photoelectric converter, a transfer gate electrode is disposed through a gate insulating film formed of a silicon oxide film and the like. Further, on the upper surface of the silicon substrate, a plurality of wiring layers made of a plurality of metal wirings are formed, and the metal wirings between the wiring layers are connected with each other through a through hole (bear hole) as appropriate.

On an uppermost wiring layer, a color filter is provided through a passivation film and a planarization film. On the color filter, a micro lens is disposed.

At a position corresponding to the micro lens and the photodiode, a waveguide that passes through the wiring layers is formed. The waveguide is formed by embedding a film having a little light-absorption property.

The waveguide optically connects an on-chip lens and a photodiode with each other and has a function of efficiently guiding light incident on the on-chip lens to the photodiode. Therefore, in the waveguide, a material having a refractive index higher than a material of an insulating film that forms the wiring layers is filled (see, for example, Japanese Patent Application Laid-open No. 2003-224249).

Along with the miniaturization, an absolute amount of incident light is reduced, and a light reception area of a photodiode that detects light is also reduced. If the degrees of the reduction are the same for colors (RGB), a spectral balance of the colors is the same as that of a previous generation, and a device design and a circuit design of a previous generation only have to be improved to a small extent.

When incident light beams have the same light amount, in a case of, for example, 1.75 μm☐ cell and 1.1 μm☐ cell, there are differences in quantum efficiency of the colors in the 1.1 μm☐ cell along with the miniaturization. The light amounts of light (natural light) that enters the on-chip lens are the same regardless of the colors. Therefore, if light losses in components, such as the on-chip lens, the color filter, the planarization film, through which the incident light is guided are constant, signals that are output from the colors are proportional to the quantum efficiencies, with the result that the balance of the colors (spectral balance) may deteriorate.

There are some reports on a correction of the spectral balance.

The amounts of incident light are different between a pixel immediately below a position where the on-chip lens is disposed and a pixel distanced from the position. Therefore, a waveguide diameter of the distanced pixel is set to be thick (see, for example, Japanese Patent Application Laid-open No. 2006-190766).

In addition, in a system in which light is caused to be incident on a side of a photodiode of a solid-state image sensor, trenches are formed on a silicon substrate, depths of the trenches are set to be different for each color, and distances from bottom surfaces of the trenches to the photodiode are changed (see, for example, Japanese Patent Application Laid-open No. 2007-184603).

SUMMARY OF THE INVENTION

There is a problem of deterioration of the spectral balance along with the miniaturization of a pixel.

In view of the above-mentioned circumstances, it is desirable to make it possible to adjust the spectral balance to be constant in differences of light dispersion angles from waveguide exit ends due to wavelengths of light of the colors.

According to an embodiment of the present invention, there is provided a solid-state image pickup apparatus including a substrate, a wiring layer, and the waveguide. The substrate is provided with a pixel array portion constituted of a plurality of pixels each having a photoelectric converter. The photoelectric converter converts incident light into an electrical signal. The wiring layer includes a plurality of wirings and an insulating layer that covers the plurality of wirings. The plurality of wirings are laminated above the substrate. The waveguide guides light to each of the photoelectric converters of the plurality of pixels. The waveguide is formed in the wiring layer. The waveguide is formed to have a waveguide exit end from which light exits the waveguide so that a distance between the waveguide exit end and a surface of the photoelectric converter that receives light from the waveguide become shorter, as wavelengths of light guided by the waveguide are longer.

In the solid-state image pickup apparatus according to the embodiment of the present invention, the distance between the waveguide exit end from which light exit the waveguide and the surface of the photoelectric converter that receives light that exits the waveguide is set to be shorter, as the wavelength of light guided by the waveguide is longer. As a result, it is possible to adjust the spectral balance in the difference of spread angles of light from the waveguide exit end due to the wavelengths of the colors.

According to another embodiment of the present invention, there is provided a method of manufacturing a solid-state image pickup apparatus. The method of manufacturing a solid-state image pickup apparatus includes forming, on a substrate, a pixel array portion constituted of a plurality of pixels each having a photoelectric converter that converts incident light to an electrical signal, forming, above the substrate, a wiring layer including multilayer wirings and an insulating layer that covers the wirings, and forming, in the wiring layer, a waveguide that guides light to the photoelectric converter of each of the plurality of pixels. The waveguide is formed to have a waveguide exit end from which light exits the waveguide so that a distance between the waveguide exit end and a surface of the photoelectric converter that receives light from the waveguide become shorter, as wavelengths of light guided by the waveguide are longer.

In the method of manufacturing a solid-state image pickup apparatus according to the embodiment of the present invention, the distance between the waveguide exit end from which light exit the waveguide and the surface of the photoelectric converter that receives light that exits the waveguide is set to be shorter, as the wavelength of light guided by the waveguide is longer. As a result, it is possible to adjust the spectral balance in the difference of spread angles of light from the waveguide exit end due to the wavelengths of the colors.

According to another embodiment of the present invention, there is provided an image pickup apparatus including a light-collecting optical portion, a solid-state image pickup apparatus, and a signal processing portion. The light-collecting optical portion collects incident light. The solid-state image pickup apparatus receives light collected by the light-collecting optical portion and perform photoelectric conversion. The signal processing portion processes a signal obtained by the photoelectric conversion. The solid-state image pickup apparatus includes a substrate provided with a pixel array portion constituted of a plurality of pixels each having a photoelectric converter that converts incident light into an electrical signal, a wiring layer including a plurality of wirings and an insulating layer that covers the plurality of wirings that are laminated above the substrate, and a waveguide to guide light to each of the photoelectric converters of the plurality of pixels, the waveguide being formed in the wiring layer, the waveguide being formed to have a waveguide exit end from which light exits the waveguide so that a distance between the waveguide exit end and a surface of the photoelectric converter that receives light from the waveguide become shorter, as wavelengths of light guided by the waveguide are longer.

In the image pickup apparatus according to the embodiment of the present invention, it is possible to adjust the spectral balance in the difference of spread angles of light from the waveguide exit end due to the wavelengths of the colors.

The solid-state image pickup apparatus of the present invention can adjust the spectral balance. Thus, an image synthesis margin can be obtained in making an adjustment for an image of a more natural color, and a color correction can be easily performed, with the result that the advantage of obtaining an image excellent in color reproducing performance can be provided.

By the method of manufacturing a solid-state image pickup apparatus of the present invention, the spectral balance can be adjusted. Thus, an image synthesis margin can be obtained in making an adjustment for an image of a more natural color, and a color correction can be easily performed, with the result that the advantage of obtaining an image excellent in color reproducing performance can be provided.

The image pickup apparatus of the present invention can adjust the spectral balance. Thus, an image synthesis margin can be obtained in making an adjustment for an image of a more natural color, and a color correction can be easily performed, with the result that the advantage of obtaining an image excellent in color reproducing performance can be provided.

These and other objects, features and advantages of the present invention will become more apparent in light of the following detailed description of best mode embodiments thereof, as illustrated in the accompanying drawings.

BRIEF DESCRIPTION OF DRAWINGS

FIG. 13 is a manufacture-process cross-sectional diagram showing the second example of the method of manufacturing the solid-state image pickup apparatus;

DESCRIPTION OF PREFERRED EMBODIMENTS

Hereinafter, embodiments of the present invention will be described with reference to the drawings.

1. First Embodiment (First Example of Structure of Solid-State Image Pickup Apparatus)

A first example of a structure of a solid-state image pickup apparatus according to a first embodiment of the present invention will be described with reference to a cross-sectional diagram of a schematic structure of FIG. 1.

Figure 1:
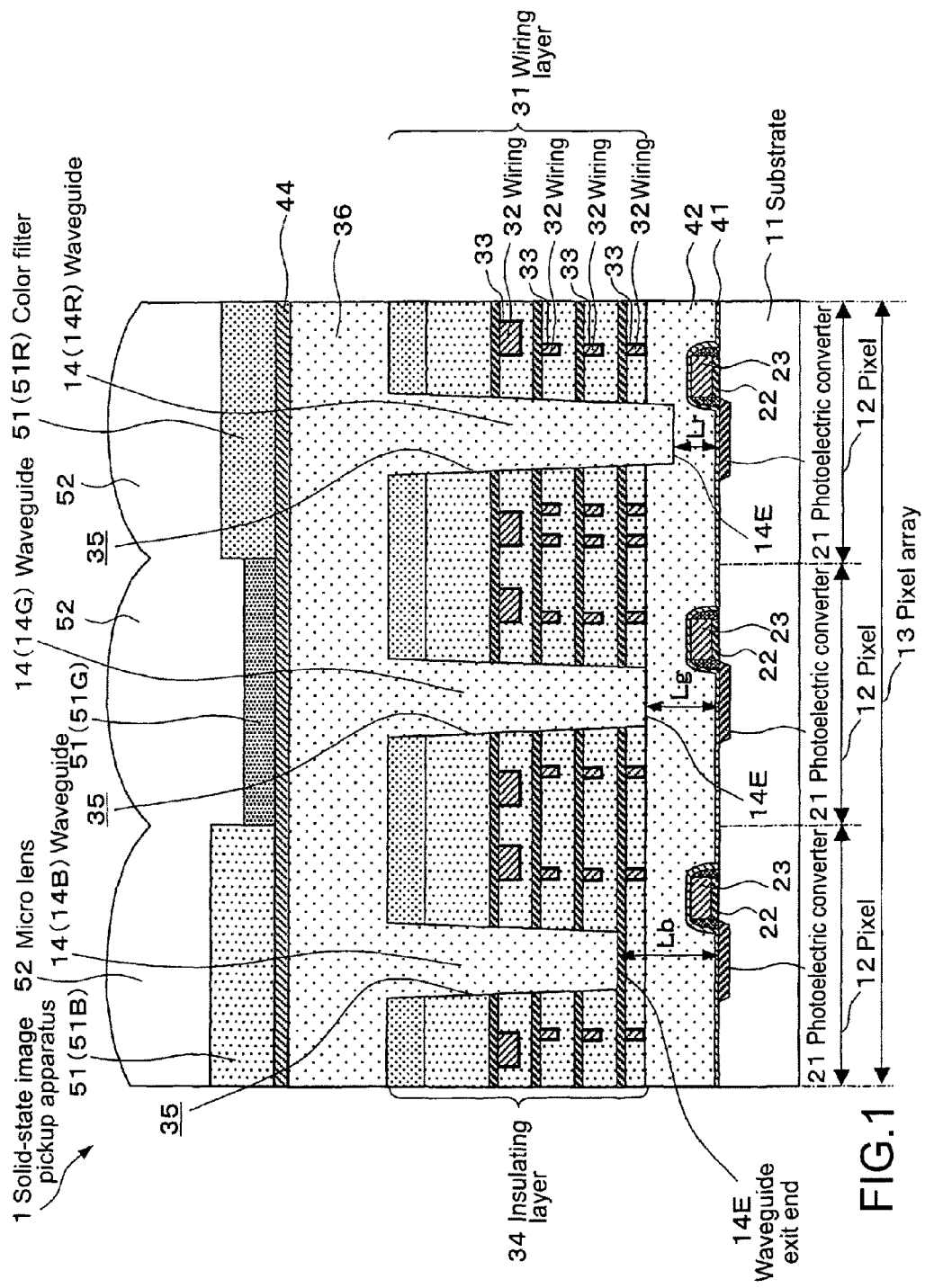
FIG. 1 is a schematic cross-sectional diagram showing a first example of a structure of a solid-state image pickup apparatus.

As shown in FIG. 1, on a substrate 11, a pixel array portion 13 constituted of a plurality of pixels 12 each including a photoelectric converter 21 is provided. The photoelectric converter 21 converts incident light to an electrical signal. For the substrate 11, for example, a silicon substrate as a semiconductor substrate is used. The photoelectric converter 21 is formed of a photodiode, for example. Further on the substrate 11, a transfer gate electrode 23 is formed to be adjacent to the photoelectric converter 21 through a gate insulating film 22.

Further, on the substrate 11, a protection film 41 that covers the photoelectric converter 21, the transfer gate electrode 23, and the like is formed. On the protection film 41, a planarization film 42 is formed.

Above the substrate 11, that is, on the planarization film 42, a plurality of wirings 32 are accumulated, and a wiring layer 31 including an insulating layer 34 that covers the plurality of wirings 32 is formed.

Each of the wirings 32 is made of metal such as copper (Cu), tungsten (W), and aluminum (Al). Around the wiring 32, a barrier metal layer 33 is formed, for example.

The insulating layer 34 is formed of, for example, a silicon oxide or a low dielectric constant material. For example, in a case where the insulating layer 34 is made of the silicon oxide or a silicon-oxide-based material, the insulating layer 34 has a refractive index of 1.4 to 1.5.

In the wiring layer 31, waveguides 14 (14B, 14G, and 14R) are formed. The waveguides 14 guide light to the photoelectric converters 21 of the plurality of pixels 12. The waveguides 14 may partly be formed in the planarization film 42. As an example, in FIG. 1, the waveguide 14R is partly formed in the planarization film 42.

The waveguides 14 will be described in detail.

The waveguides 14 are each formed by filling a waveguide material 36 into waveguide holes 35. The waveguide holes 35 are formed in the wiring layer 31 so as to be separated from the wirings 32. For example, as shown in FIG. 1, the waveguide material 36 fills the waveguide holes 35, and is also formed on an upper portion of the insulating layer 34 of the wiring layer 31. Accordingly, the waveguide material 36 filled in the waveguide holes 35 serves as the waveguides 14.

In addition, in the waveguides 14, distances L (Lb, Lg, and Lr) between waveguide exit ends 14E from which light exits the waveguides 14 and the surfaces of the photoelectric converters 21 that receive light exited are set to be shorter, as wavelengths of light beams that are guided by the waveguides 14 are longer. The waveguide exit ends 14E corresponds to the bottom portions of the waveguide holes 35.

The waveguide material 36 that forms the waveguides 14 is formed of a material having a refractive index higher than that of the insulating layer 34, specifically, for example, a material having a high transmittance of a wavelength in a visible light area. Examples of the material include a silicon nitride film, a diamond film, a composite material film of diamond and an organic-based material, a composite material film of titanium oxide and an organic-based material, and the like.

The waveguides 14 are constituted of the first color (red) pixel waveguide 14R, a second color (green) pixel waveguide 14G, and a third color (blue) waveguide 14B. The wavelengths of the first color (red), the second color (green), and the third color (blue) are shorter in the stated order. For example, a red color wavelength $\lambda r=650$ nm, a green color wavelength $\lambda g=550$ nm, and a blue color wavelength $\lambda b=450$ nm are obtained. Those wavelengths are obtained at peak light intensities of the colors.

In addition, above each of the waveguides 14 (light incident side), a color filter 51 is formed through a planarization film 44 that covers the waveguide material 36. On the color filter 51, a micro lens 52 that guides the incident light to a light entry of each of the waveguides 14 is formed.

In this way, the micro lens 52 and the photoelectric converter 21 are optically connected to each other through each of the waveguides 14.

Next, a description will be given on the distances L between the waveguide exit ends 14E and the surfaces of the photoelectric converters 21 that receive light exited from the waveguides 14.

A distance between the waveguide exit end 14E of the waveguide 14R from which red light that has passed through a red color filter 51R exits and the surface of the photoelectric converter 21 that receives light that has exited the waveguide 14R is set as a distance Lr. Similarly, a distance between the waveguide exit end 14E of the waveguide 14G from which green light that has passed through a green color filter 51G exits and the surface of the photoelectric converter 21 that receives light that has exited the waveguide 14G is set as a distance Lg. A distance between the waveguide exit end 14E of the waveguide 14B from which blue light that has passed through a blue color filter 51B exits and the surface of the photoelectric converter 21 that receives light that has exited the waveguide 14B is set as a distance Lb.

The distance Lr of the red pixel waveguide 14R is set to be shorter than the distance Lg of the green pixel waveguide 14G. Further, the distance Lg of the green pixel waveguide 14G is set to be shorter than the distance Lb of the blue pixel waveguide 14B.

As an example, the size of each of the photoelectric converter 21 is set to 1.1 µm□, a diameter of the waveguide exit end 14E of the waveguide 14B is set to 460 nm. In this case, for example, when the distance Lr=580 nm is set, Lg=690 nm, and Lb=840 nm are set.

It should be noted that in a case where the distances L (Lr, Lg, and Lb) are less than 300 nm, light that exits the waveguide exit ends 14E is almost completely received by the photoelectric converters 21 irrespective of the wavelengths of light that enters the waveguides 14.

Accordingly, in a case where the distance Lr<300 nm, the distance Lg<300 nm, and the distance Lb<300 nm are satisfied, a relationship of Lr=Lg=Lb can be set.

Of course, when the size of the photoelectric converter 21 is further reduced to be less than 1.1 µm□, it is necessary to reduce the distances L.

Next, an example of determining the distance L will be described with reference to FIG. 2.

Figure 2:
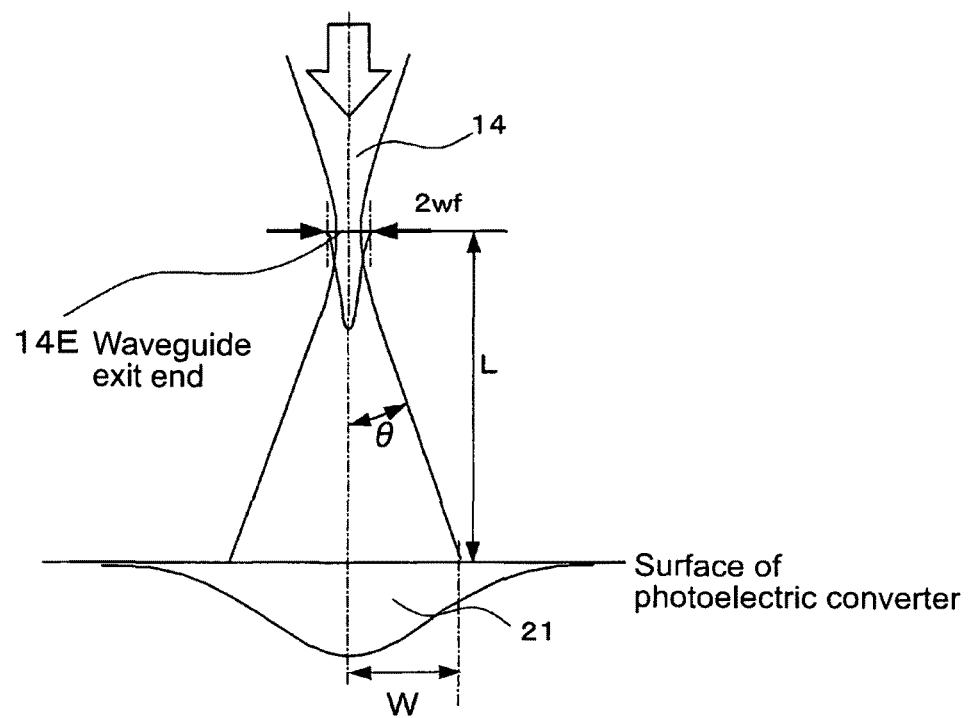
FIG. 2 is an optical path diagram from a waveguide exit end to a photoelectric converter.

As shown in FIG. 2, light that exits the waveguide exit end 14E spreads by diffraction and reaches the surface of the photoelectric converter 21.

Here, a spread angle of the light that has exited the waveguide exit end 14E is represented by $\theta$, a radius of the waveguide 14 at the waveguide exit end 14E is represented by wf, and the distance from the waveguide exit end 14E of the waveguide 14 to the surface of the photoelectric converter 21 is represented by L. Further, a wavelength of the incident light is represented by $\lambda$, and a radius of a spot formed on the surface of the photoelectric converter 21 is represented by W. The following relational expression can be obtained.

$$\tan\theta = W/L = \lambda/(\pi wf) \qquad (1)$$

Therefore, the expression (1) can be transformed as follows.

$$wf = \lambda L/\pi W \qquad (2)$$

In the expression (2), the spot radius W is changed depending on the wavelengths $\lambda$ and the distances L. This is because different diffraction states are obtained depending on the difference in the wavelengths $\lambda$, and the shorter the wavelength λ becomes, the more the light that has exited the waveguide exit end 14E spreads.

Figure 3:
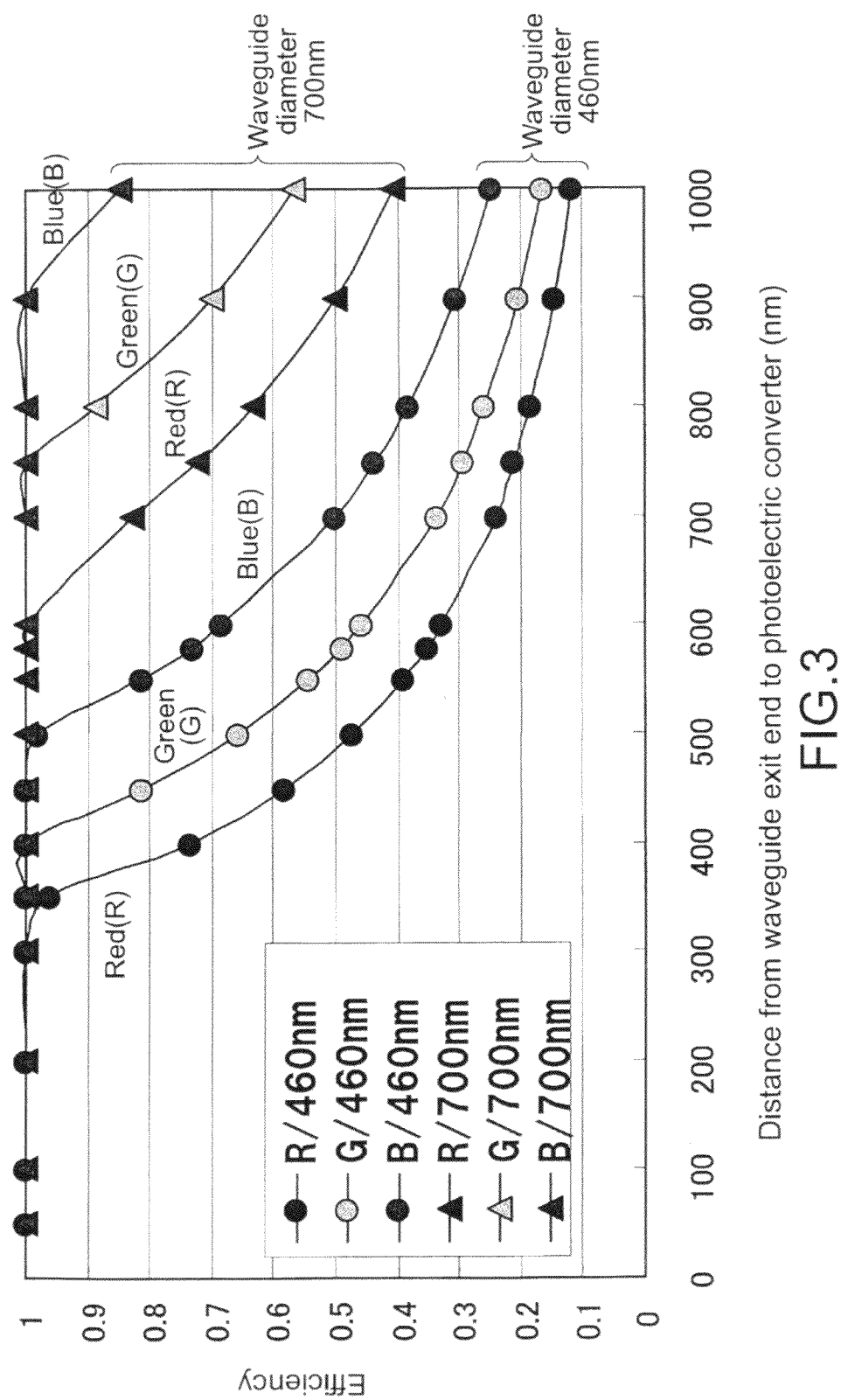
FIG. 3 is a graph showing a relationship between an efficiency and a distance from the waveguide exit end to the photoelectric converter.

Here, from the expression (2), an efficiency that is a ratio of a spot diameter (2 W) for each wavelength λ with respect to the distance L to a light reception area of the photoelectric converter 21 is calculated with a diameter (2 wf) of the waveguide exit end 14E of the waveguide 14 being a parameter. FIG. 3 shows a result of the calculation. In this case, an area of the photoelectric converter 21 is set to 0.3 μm². At this time, the red color wavelength λr=650 nm, the green color wavelength λg=550 nm, and the blue color wavelength λb=450 nm are set.

As shown in FIG. 3, in the case where the diameter 2 Wf of the waveguide exit end 14E is 460 nm or 700 nm, when the distance L is less than 300 nm, the efficiency is 1. That is, light exited from the waveguide exit end 14E completely reaches the photoelectric converter 21.

Further, in the case of 2 wf=700 nm, the efficiency becomes constant (efficiency=1), when Lr=580 nm, Lg=690 nm, and Lb=840 nm are set.

As shown in FIG. 3, by determining the efficiency that is the ratio of the spot diameter (2 W) for each wavelength λ with respect to the distance L to the light reception area of the photoelectric converter 21 with the diameter (2 wf) of the waveguide exit end 14E being set as the parameter, the distance L for each color can be easily obtained.

Figure 4:
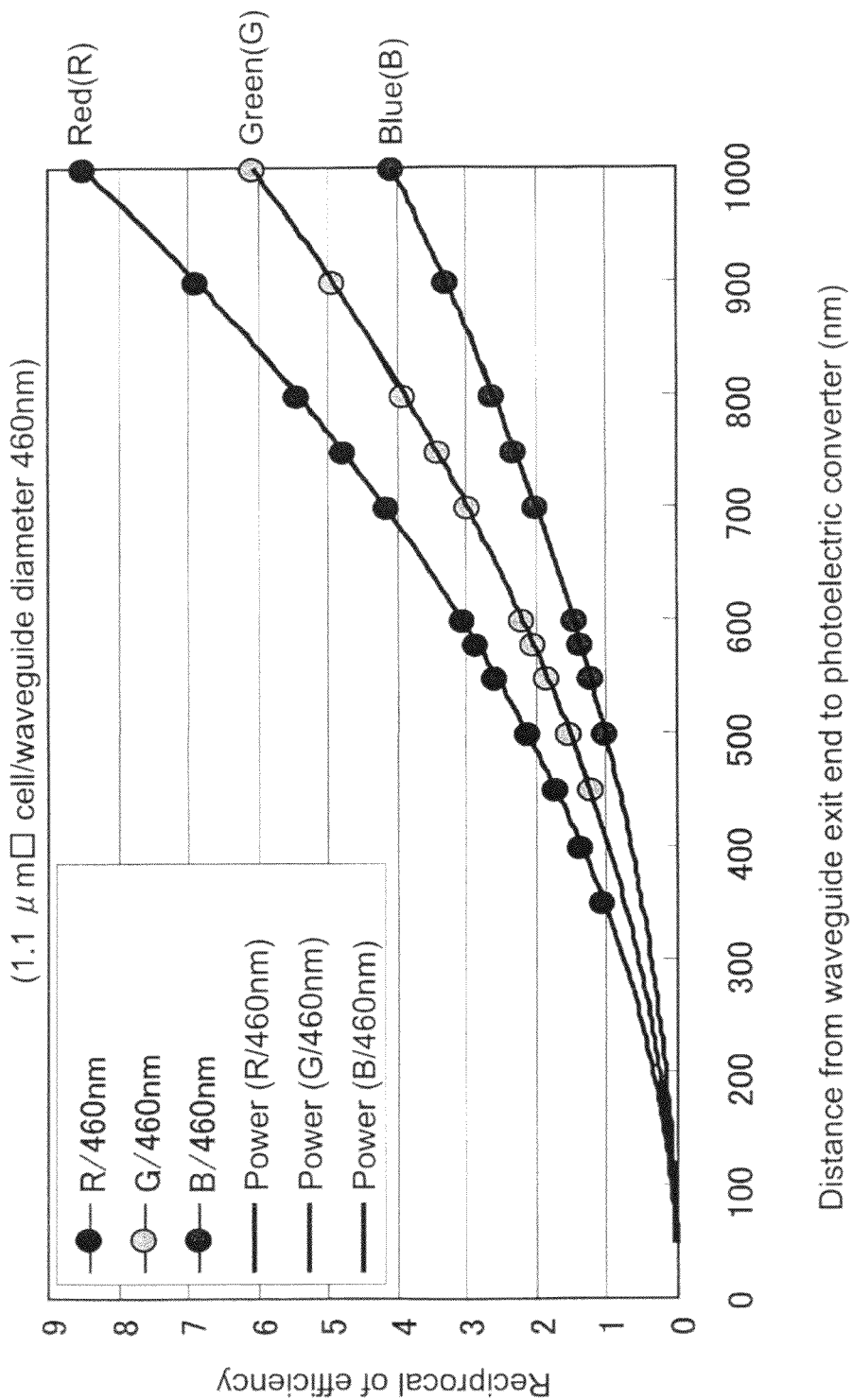
FIG. 4 is a graph showing a relationship between a reciprocal of the efficiency and the distance from the waveguide exit end to the photoelectric converter.

In addition, in the case of the 1.1 μm☐ cell shown in FIG. 3, a reciprocal of the efficiency is obtained and corresponded to a vertical axis, and the distance L from the waveguide exit end 14E to the surface of the photoelectric converter 21 is corresponded to a lateral axis in a graph shown in FIG. 4.

From a relationship between the reciprocal of the efficiency of the colors and the distance L for each color shown in FIG. 4, in a case where the relationship among distances Lr, Lg, and Lb is approximated by using a quadric equation with the reciprocal of the efficiency being set as a constant value, the following expression can be obtained as an approximation.

$$8Lr^2 = 6Lg^2 = 4Lb^2 \quad (3)$$

Accordingly, for example, when the distance Lr is set, the distances Lg and Lb can be determined. The same holds true for the distance Lg or Lb.

It should be noted that the distance L of each color obtained by using the expression (2) and the distance L of each color obtained by using the expression (3) may have an approximately 4% margin of error, but the margin of error is within the same margin of error in a manufacturing process of a semiconductor. Therefore, the margin of error is a matter of no importance.

In the above, the description is given on the case where the light dispersed by the color filter 51 is the red, green, and blue light. The dispersion by the color filter 51 is not limited to the above colors, and light dispersed may be complementary colors of the above colors. In addition, it is desirable to adjust the distance L from the waveguide exit end 14E of the waveguide 14 to the surface of the photoelectric converter 21 for a wavelength of colors other than the red, green, and blue, such as orange and blue green.

(Modified Example of First Example of Structure of Solid-State Image Pickup Apparatus)

Further, in a case where the light incident positions of the waveguides 14 are set on the same plane, and the surfaces of the photoelectric converters 21 are positioned on the same surface of the substrate 11, it is possible to perform prescription based on the depths of the waveguides 14. That is, a value obtained by subtracting the distance L from a distance between the surface of the substrate 11 and a plane on which the light incident position of each waveguide 14 is disposed corresponds to the depth of each waveguide 14. In this case, the depth of the red pixel waveguide 14R is the largest, and the depth of the blue pixel waveguide 14B is the smallest. The depth of the green pixel waveguide 14G is smaller than that of the red pixel waveguide 14R and larger than that of the blue pixel waveguide 14B.

For example, in a case where the thickness of the wiring layer 31 is 2000 nm, the depths of the blue pixel waveguide 14B, the green pixel waveguide 14G, and the red pixel waveguide 14R are approximately 1600 nm to 1800 nm, 1800 nm to 2000 nm, and 2000 nm to 2200 nm, respectively. But, the number of wiring layers of the wiring 32, the height of the wiring 32, the height of the insulating layer 34, and the like are linked to a device speed, a power consumption, or the like, so the depth of the waveguide is selected in accordance with a performance of an apparatus.

(First Comparative Example of Solid-State Image Pickup Apparatus)

Next, a description will be given on a first comparative example with reference to FIG. 5.

Figure 5A:
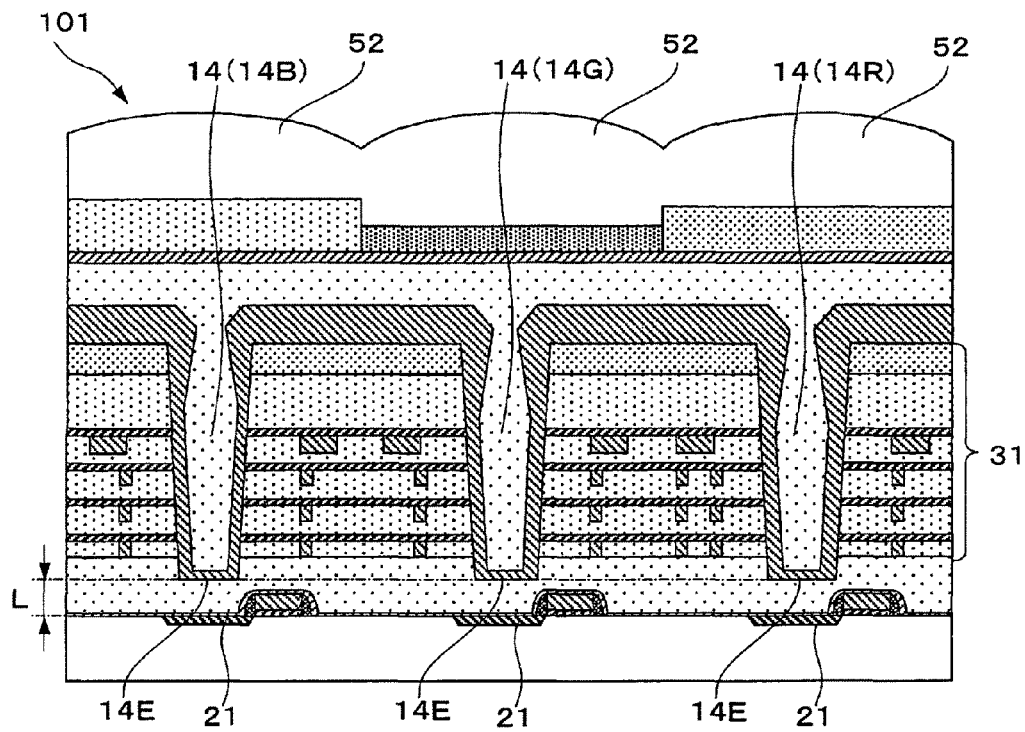
FIG. 5 is a cross-sectional diagram of a schematic structure for explaining a first comparative example and a graph showing a relationship between the efficiency and a wavelength.

As shown in FIG. 5A, in a solid-state image pickup apparatus 101 of a first comparative example, a structure other than the waveguides 14 is the same as that of the solid-state image pickup apparatus 1 described above with reference to FIG. 1. Therefore, only the waveguides 14 will be described.

The waveguides 14 formed in the wiring layer 31 are the red pixel waveguide 14R, the green pixel waveguide 14G, and the blue pixel waveguide 14B. The distance L from the waveguide exit end 14E of each of the waveguides 14 to the surface of the photoelectric converter 21 is constant.

For example, in the solid-state image pickup apparatus 101 of the first comparative example, the photoelectric converter 21 is formed to be 1.4 μm☐, and a diameter of each of the waveguide exit ends (bottom portions) 14E of the waveguides 14 is formed to be 700 nm. The distances L are each formed to be 580 nm.

Figure 5B:
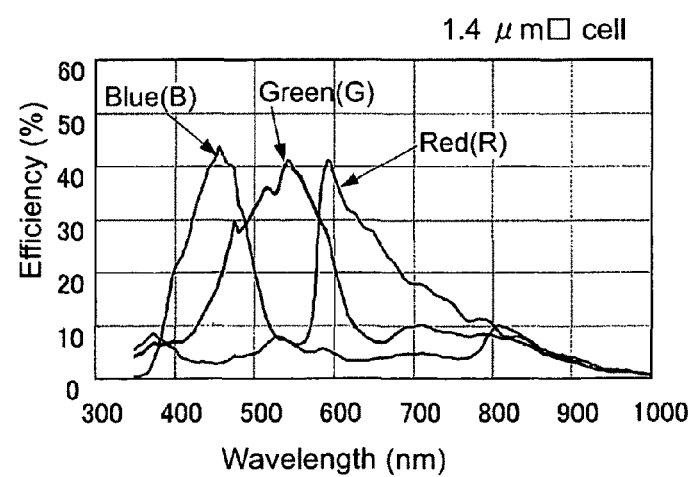

In this case, as shown in FIG. 5B, an efficiency of the solid-state image pickup apparatus 101 is 40% to 45% in each of the red, green, and blue colors, and an approximately constant value is obtained.

Therefore, a difference of the efficiencies is not caused depending on the colors. Further, a difference of the efficiencies due to the distance L from the waveguide exit end 14E to the photoelectric converter 21 is not caused in a case of L=580 nm. Thus, as described above, the distance L is set to 580 nm.

Figure 6A:
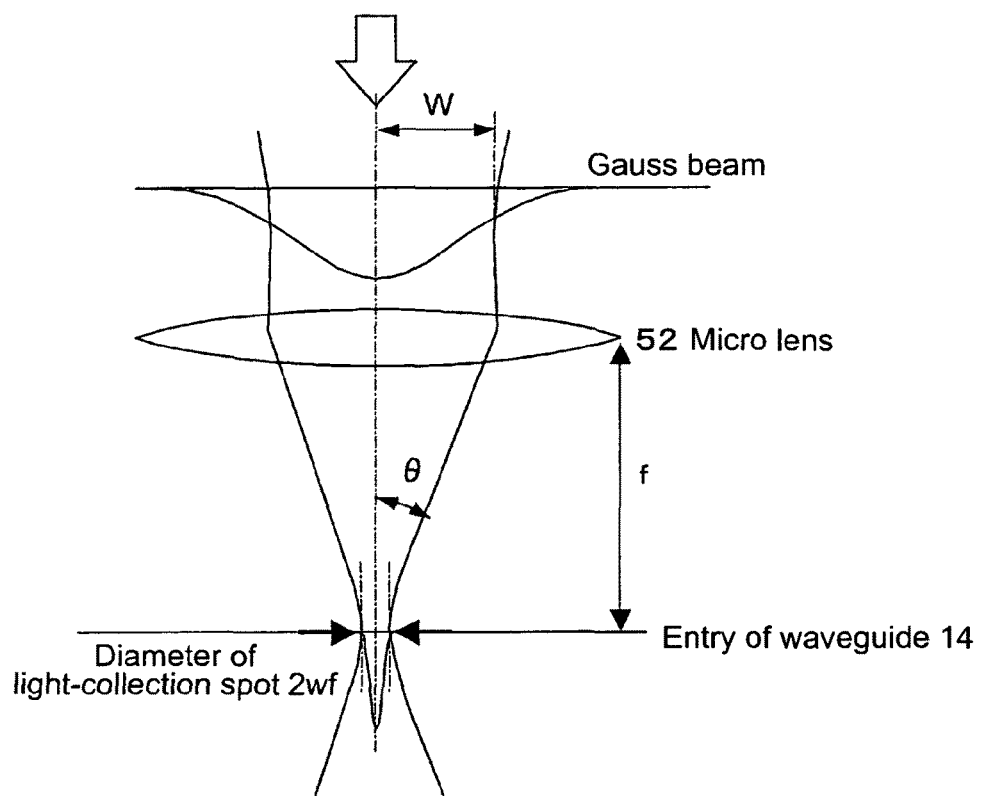
FIG. 6 is an optical path diagram from a micro lens to an entry of the waveguide and a graph showing a relationship of the waveguide exit end to the photoelectric converter.

In addition, the efficiencies from the micro lens 52 to the waveguide exit end 14E are constant irrespective of the colors. For example, as shown in FIG. 6A, light that has exited the micro lens 52 is collected and focused on an entry of the waveguide 14.

Here, an incident angle of light that is focused on the entry of the waveguide 14 is represented by θ, a light-collecting spot radius at the entry of the waveguide 14 is represented by wf, and a distance from the micro lens 52 to the entry of the waveguide 14 is represented by f. Further, a wavelength of the incident light is represented by λ, and a radius of light that reaches the surface of the micro lens 52 is represented by W. An expression (4) of wf=λf/πW can be obtained as in the expression (2) described above. In actuality, the radius W of the incident light corresponds to a radius of the micro lens 52.

Figure 6B:
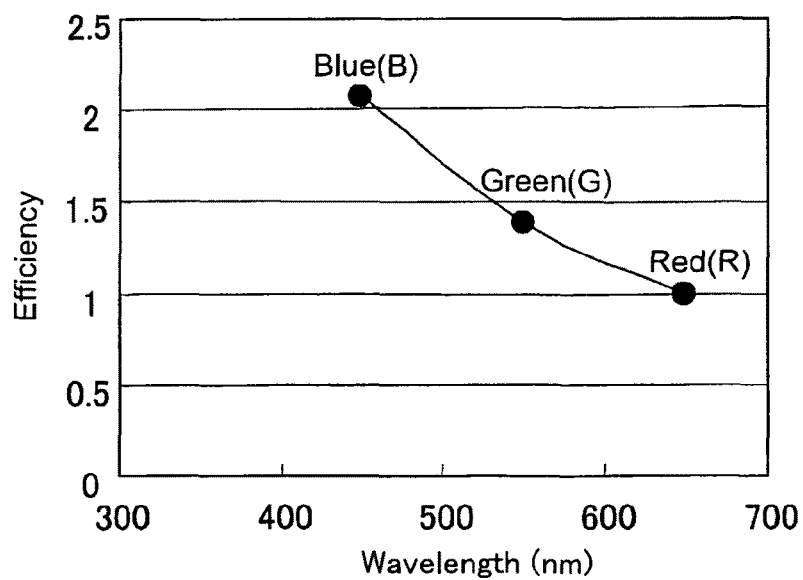

Based on the expression (4), a calculation is executed in the case where the collected light spot diameter and the waveguide diameter are 700 nm. As a result, as shown in FIG. 6B, the efficiency from the micro lens 52 to the waveguide exit end 14E becomes 1 or more in the cases of the red (R), green (G), and blue (B) light. Accordingly, the light collected to the micro lens 52 is completely guided to the entry of the waveguide 14 of the incident light irrespective of the colors of light.

(Second Comparative Example of Solid-State Image Pickup Apparatus)

Figure 7A:
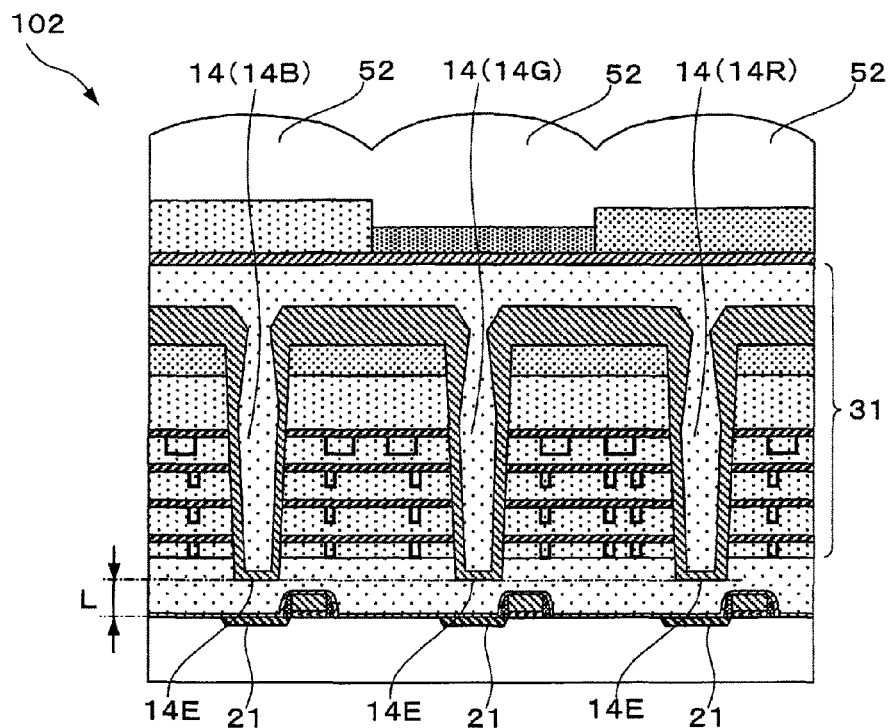
FIG. 7 is a cross-sectional diagram of a schematic structure for explaining a second comparative example and a graph showing a relationship between the efficiency and the wavelength.

On the other hand, as shown in FIG. 7A, in a solid-state image pickup apparatus 102 of a second comparative example, a structure other than the waveguides 14 is the same as that of the solid-state image pickup apparatus 1 described above with reference to FIG. 1. Therefore, only the waveguides 14 will be described.

The waveguides 14 formed in the wiring layer 31 are the red pixel waveguide 14R, the green pixel waveguide 14G, and the blue pixel waveguide 14B. The distances L from the waveguide exit ends 14E of the waveguides 14 to the surfaces of the photoelectric converters 21 are constant.

For example, in the solid-state image pickup apparatus 102 of the second comparative example, each of the photoelectric converters 21 is formed to be 1.1 µm□, and each of the diameters of the waveguide exit ends 14E of the waveguides 14 is formed to be 460 nm. Each of the distances L is formed to be 580 nm.

Figure 7B:
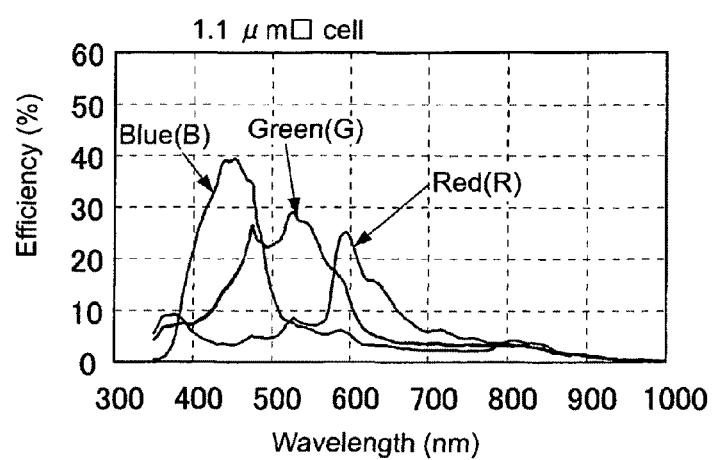

In this case, as shown in FIG. 7B, the efficiencies of the solid-state image pickup apparatus 102 are about 40%, 30%, and 25% in the waveguide 14R of the red light (R), the waveguide 14G of green light (G), and the waveguide 14B of blue light (B), respectively. Thus, the efficiency is varied depending on the wavelengths of light guided by the waveguides 14. In particular, attenuation of the red color is large. This is because the spread angle of the red light at a time when the light exits the waveguide 14R is larger than those of the green and blue light, since the efficiencies of the colors from the micro lens 52 to the entries of the waveguides 14 are the same.

As described above, as the cell size, that is, the size of the photoelectric converter 21 becomes smaller, the efficiency of the solid-state image pickup apparatus 102 is reduced, and the efficiency is significantly varied depending on the wavelengths.

It should be noted that the light reception efficiencies of the photoelectric converters 21 with respect to the respective colors are not different, because the photoelectric converters 21 are made of silicon. The silicon has a band gap energy of 1.1 eV to 1.2 eV, which corresponds to a wavelength of 1100 nm. That is, even the red light having the longest wavelength of 650 nm falls within the absorption area of the photoelectric converter 21.

On the other hand, as shown in FIG. 3, in the solid-state image pickup apparatus 1, when an adjustment is made to the efficiency of the waveguide 14R that guides the red light, the distance Lr of the waveguide 14R is 580 nm, the distance Lg of the waveguide 14G is 690 nm, and the distance Lb of the waveguide 14B is 840 nm. At this time, the efficiencies become constant at 35%.

As described above, in the solid-state image pickup apparatus 1, even when the pixel size is reduced, the efficiency can be constant as in the solid-state image pickup apparatus 101 having the large pixel size in the first comparative example. In other words, the light amounts of the red, green, and blue light guided by the waveguides 14 can be set to be constant. Further, by adjusting the distances L of the waveguides 14 (for example, waveguides 14G and 14B) that guide light having the shorter wavelength to the waveguide 14 (for example, waveguide 14R) that guides light having the longer wavelength, a design in which the waveguide 14 penetrates the photoelectric converter 21 is avoided.

Therefore, in the solid-state image pickup apparatus 1, it is possible to adjust the spectral balance in the differences of the spread angles from the waveguide exit ends 14E of the waveguides 14 due to the wavelengths of light of the colors. Therefore, at a time when signals that are output from the photoelectric converters 21 that receive the red, green, and blue light are synthesized and adjusted to obtain an image of a more natural color, a margin is obtained in the image synthesis, and a color correction can be easily performed, which can provide an advantage of obtaining an image excellent in color reproducing performance.

Further, the solid-state image pickup apparatus 1 has the structure in response to the miniaturization. Therefore, for further miniaturization, the distances L from the waveguide exit ends 14E of the waveguides 14 to the surface of the photoelectric converters 21 are set, thereby making it possible to respond to the development of a next-generation solid-state image pickup apparatus. Thus, it is possible to improve the developing speed of the next-generation solid-state image pickup apparatus and reduce the cost for the development thereof, with the result that the cost reflected to a product can be significantly reduced.

(Second Example of Structure of Solid-State Image Pickup Apparatus)

A second example of a structure of the solid-state image pickup apparatus according to the first embodiment of the present invention will be described with reference to a cross-sectional diagram of a schematic structure of FIG. 8. The second example is different from the first example only in the structure of the waveguides 14, and the other components are the same as those of the first example.

Figure 8:
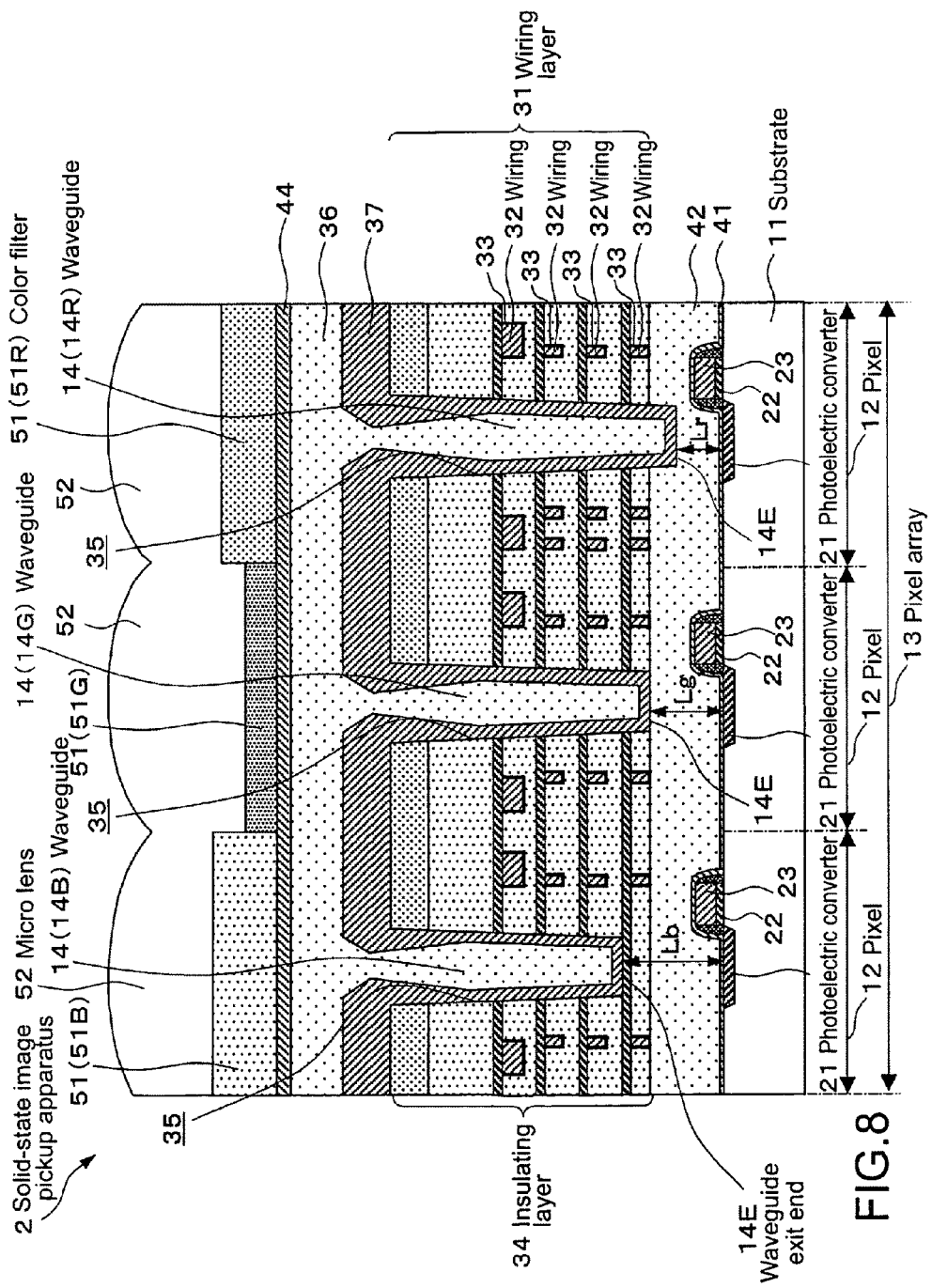
FIG. 8 is a schematic cross-sectional diagram showing a second example of the structure of the solid-state image pickup apparatus.

As shown in FIG. 8, on the substrate 11, the pixel array portion 13 constituted of the plurality of pixels 12 each including the photoelectric converter 21 is provided. The photoelectric converter 21 converts incident light to an electrical signal. Further on the substrate 11, the transfer gate electrode 23 is formed to be adjacent to the photoelectric converter 21 through the gate insulating film 22.

Further, on the substrate 11, the protection film 41 that covers the photoelectric converter 21, the transfer gate electrode 23, and the like is formed. On the protection film 41, the planarization film 42 is formed.

Above the substrate 11, that is, on the planarization film 42, the plurality of wirings 32 are accumulated, and the wiring layer 31 including the insulating layer 34 that covers the plurality of wirings 32 is formed.

Each of the wirings 32 is made of metal such as copper, tungsten, and aluminum. Around the wiring 32, a barrier metal layer 33 is formed, for example.

The insulating layer 34 is formed of, for example, a silicon oxide or a silicon-oxide-based material having a low dielectric constant. The silicon-oxide-based material has a refractive index of 1.4 to 1.5.

In the wiring layer 31, the waveguides 14 (14B, 14G, and 14R) are formed. The waveguides 14 guide light to the photoelectric converters 21 of the plurality of pixels 12. The waveguides 14 may partly be formed in the planarization film 42. As an example, in the figure, the waveguide 14R is partly formed in the planarization film 42.

The waveguides 14 are formed by filling, through a passivation film 37, the waveguide material 36 into waveguide holes 35. The waveguide holes 35 are formed in the wiring layer 31 so as to be separated from the wirings 32. Further, the passivation film 37 and the waveguide material 36 are also formed on the upper portion of the insulating layer 34 of the wiring layer 31. Accordingly, the waveguide material 36 filled in the waveguide hole 35 serves as the waveguide 14.

In addition, in the waveguide 14, the distances L (Lb, Lg, and Lr) between the waveguide exit ends 14E from which light exits the waveguides 14 and the surfaces of the photoelectric converters 21 that receive light exited are set to be shorter, as the wavelengths of light beams that are guided by the waveguides 14 are longer. The waveguide exit ends 14E correspond to each of bottom portions of the waveguide holes 35.

The waveguide material 36 (waveguides 14) is formed of a material having a refractive index higher than the insulating layer 34, for example, a material having a high transmittance of a wavelength in a visible light area. Examples of the material include a silicon nitride film, a diamond film, a composite material film of diamond and an organic-based material, a composite material film of titanium oxide and an organic-based material, and the like.

The waveguide 14 is constituted of the first color (red) pixel waveguide 14R, the second color (green) pixel waveguide 14G, and the third color (blue) waveguide 14B. The wavelengths of the first color (red), the second color (green), and the third color (blue) become shorter in the stated order. For example, the red color wavelength $\lambda r=650$ nm, the green color wavelength $\lambda g=550$ nm, and the blue color wavelength $\lambda b=450$ nm are set.

In addition, above each of the waveguides 14 (light incident side), the color filter 51 is formed through the planarization film 44. On the color filter 51, the micro lens 52 that guides the incident light to the light entry of the waveguide 14 is formed.

In this way, the micro lens 52 and the photoelectric converter 21 are optically connected to each other through the waveguide 14.

Further, the distance L between the waveguide exit end 14E and the surface of the photoelectric converter 21 that receives light that exits the waveguide 14 is set in the same way as the first example.

The distance Lr of the red-color pixel waveguide 14R is set to be shorter than the distance Lg of the green pixel waveguide 14G. Further, the distance Lg of the green pixel waveguide 14G is set to be shorter than the distance Lb of the blue pixel waveguide 14B.

As an example, the size of the photoelectric converter 21 is set to 1.1 μm□, the diameter of the waveguide exit end 14E of the waveguide 14B is set to 460 nm. In this case, for example, when the distance Lr=580 nm is set, Lg=690 nm, and Lb=840 nm are obtained.

It should be noted that in a case where the distances L are less than 300 nm, light that exits the waveguide exit ends 14E is almost completely received by the photoelectric converters 21 irrespective of the wavelengths of light that enters the waveguides 14.

Accordingly, in a case where the distance Lr<300 nm, the distance Lg<300 nm, and the distance Lb<300 nm are satisfied, Lr=Lg=Lb can be set.

Of course, when the size of the photoelectric converter 21 is further reduced to be less than 1.1 μm□, it is necessary to reduce the distances L.

In the solid-state image pickup apparatus 2, the same operation and effect as those in the solid-state image pickup apparatus 1 described above can be obtained.

2. Second Embodiment (First Example of Method of Manufacturing Solid-State Image Pickup Apparatus)

Next, a description will be given on a first example of a method of manufacturing a solid-state image pickup apparatus according to a second embodiment of the present invention with reference to manufacture-process cross-sectional diagrams of FIGS. 9 to 11.

Figure 9A:
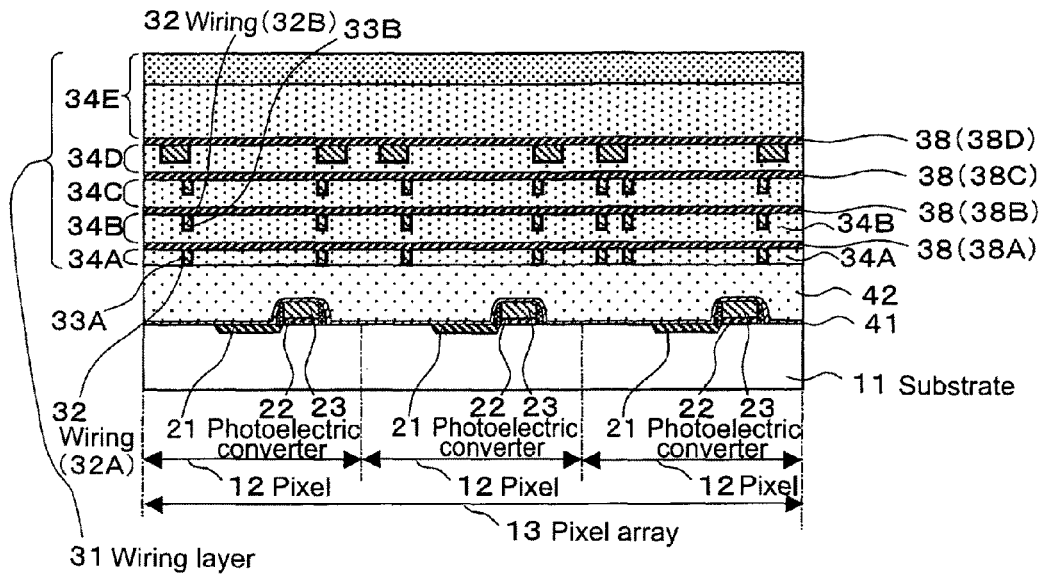
FIG. 9 is a manufacture-process cross-sectional diagram showing a first example of a method of manufacturing the solid-state image pickup apparatus.

As shown in FIG. 9A, on the substrate 11, the pixel array portion 13 constituted of the plurality of pixels 12 each including the photoelectric converter 21 that converts the incident light into an electrical signal is formed. For the substrate 11, a silicon substrate is used as a semiconductor substrate, for example. The photoelectric converter 21 is formed of a photodiode, for example. Further, on the substrate 11, the transfer gate electrode 23 is formed to be adjacent to the photoelectric converter 21 through the gate insulating film 22. In addition, a pixel transistor, a peripheral circuit, and the like (not shown) are also formed.

On the substrate 11, the protection film 41 that covers the photoelectric converter 21, the transfer gate electrode 23, and the like is further formed. On the protection film 41 as an insulating film, the planarization film 42 is formed.

After that, a connection hole (not shown) for electrical connection with the substrate 11, the transfer gate electrode 23, and the like is formed. A metal material such as tungsten (W), copper (Cu), and aluminum (Al) is filled in the connection hole, thereby forming a plug. The plug is formed by forming the metal material that fills the connection holes over an entire surface of the planarization film 42 and then removing an extra metal material by using a chemical mechanical polishing (CMP) method or the like.

After that, a first insulating layer 34A in which a first wiring layer is formed is formed, and then a wiring groove is formed in the first wiring layer 34A. Next, a barrier metal layer 33A is formed on an inner surface of the wiring groove. Further, a low-resistive wiring material (e.g., copper (Cu) and aluminum (Al)) that serves as a main wiring that is embedded in the wiring groove is formed, and then the extra wiring material and barrier metal layer are removed, to form the first wiring 32 (32A). For the removal process, a chemical mechanical polishing is used, for example.

In this way, the first wiring layer 31A is formed.

Subsequently, an etching stopper layer 38 (38A) is formed on the first insulating layer 34A. The etching stopper layer 38A covers an upper portion of the first wiring 32A. The etching stopper layer 38A serves as a barrier layer for preventing diffusion of copper (Cu) or the like, and is formed of an insulating film such as a silicon nitride (SiN) film and a silicon carbide (SiC) film.

Next, a second insulating layer 34B is formed. The second insulating layer 34B is formed of a silicon oxide film or a low-dielectric constant material (silicon oxide carbide (SiOC), methylsilsesquioxane (MSQ), hydro-silsesquioxane (HSQ), or the like) film, for example.

Next, by a dual damascene method or the like, a connection hole (not shown) and a wiring groove are formed in the second insulating layer 34B.

Subsequently, a main wiring material is embedded in the wiring groove and the connection hole through the barrier metal layer 33B. Then, the extra main wiring material and barrier metal layer are removed by the chemical mechanical polishing or the like, thereby forming a second wiring 32 (32B) in the wiring groove through the barrier metal layer 33B and forming a plug (not shown) in the connection hole through the barrier metal layer.

In this way, a second wiring layer 31B is formed.

Further, on the second wiring layer 31B, an etching stopper layer 38 (38B) is formed as in the case of the formation on the first wiring layer 31A. The etching stopper layer 38B serves as a barrier layer for preventing the diffusion of copper (Cu)

or the like, and is formed of an insulating film such as a silicon nitride (SiN) film and a silicon carbide (SiC) film.

Hereinafter, as in the case of the second wiring layer 31B, a third wiring layer 31C, an etching stopper layer (38C), a fourth wiring layer 31D, and an etching stopper layer 38 (38D) are formed. Further, an insulating layer 34E is formed.

In this way, the wiring layer 31 is formed.

Figure 9B:
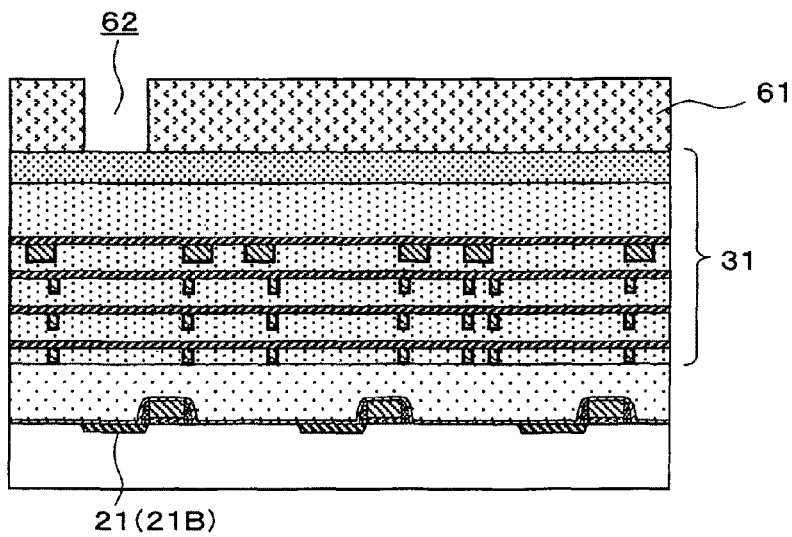

Next, as shown in FIG. 9B, on the wiring layer 31, a resist film 61 is formed, and an opening portion 62 is formed (in the light incident direction) above the photoelectric converter 21 (21B) that receives the third color (e.g., blue) light by the lithography technique.

Figure 10A:
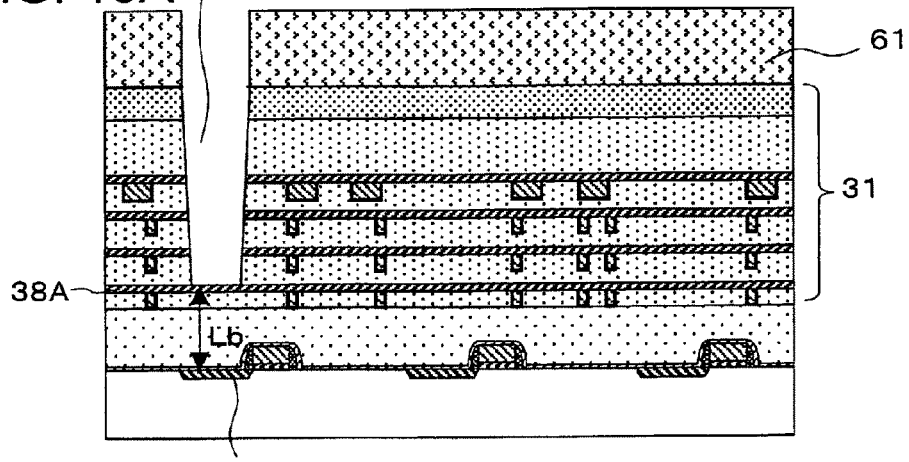
FIG. 10 is a manufacture-process cross-sectional diagram showing the first example of the method of manufacturing the solid-state image pickup apparatus.

Next, as shown in FIG. 10A, the resist film 61 is used as an etching mask, and the wiring layer 31 is etched, thereby forming the waveguide hole 35 (35B) up to the surface of the etching stopper layer 38A, for example. At this time, the distance Lb from the bottom portion of the waveguide hole 35B to the surface of the photoelectric converter 21 (21B) is set to 840 nm. That is, the upper surface of the etching stopper layer 38A is formed to have the height of 840 nm from the photoelectric converter 21B.

After that, the resist film 61 is removed. In the figure, a state immediately before the removal of the resist film 61 is shown.

Figure 10B:
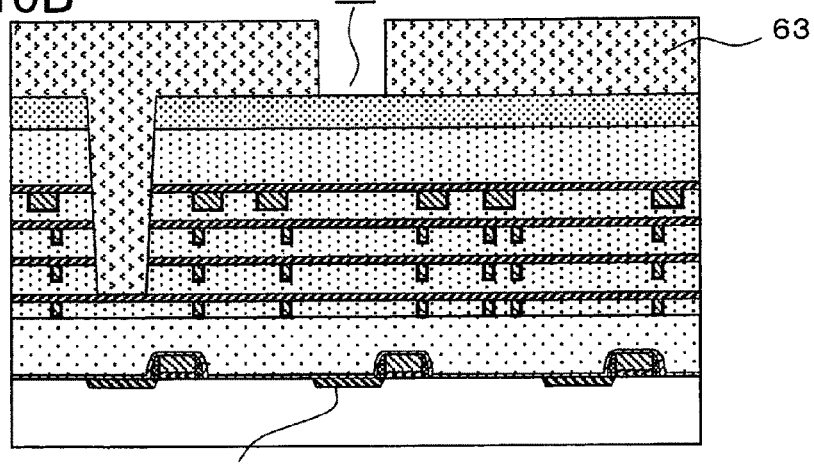

Next, as shown in FIG. 10B, on the wiring layer 31, a resist film 63 is formed, and an opening portion 64 is formed (in the light incident direction) above the photoelectric converter 21 (21G) that receives the second color (e.g., green) light by the lithography technique.

Figure 10C:
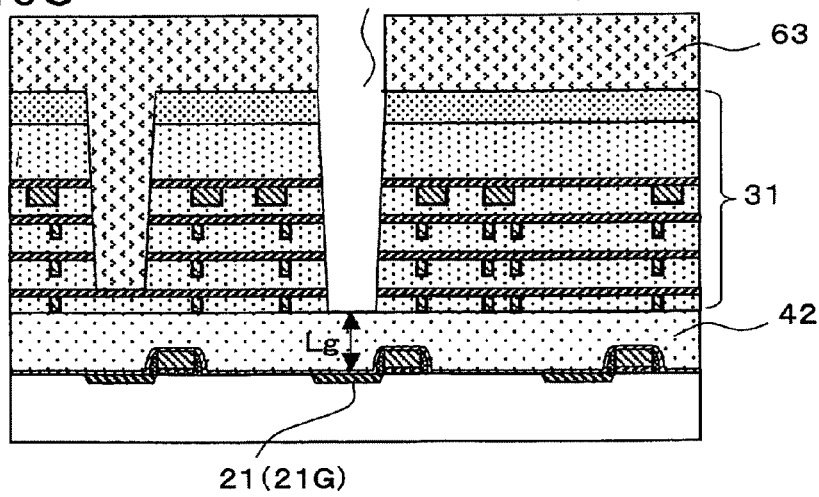

Next, as shown in FIG. 10C, the resist film 63 is used as an etching mask, and the wiring layer 31 is etched, thereby forming the waveguide hole 35 (35G) up to the surface of the planarization film 42, for example. Therefore, the planarization film 42 serves as the etching stopper layer. At this time, the distance Lg from the bottom portion of the waveguide hole 35G to the surface of the photoelectric converter 21 (21G) is set to 690 nm. That is, the upper surface of the planarization film 42 is formed to have the height of 690 nm from the photoelectric converter 21G.

After that, the resist film 63 is removed. In the figure, a state immediately before the removal of the resist film 63 is shown.

Figure 11A:
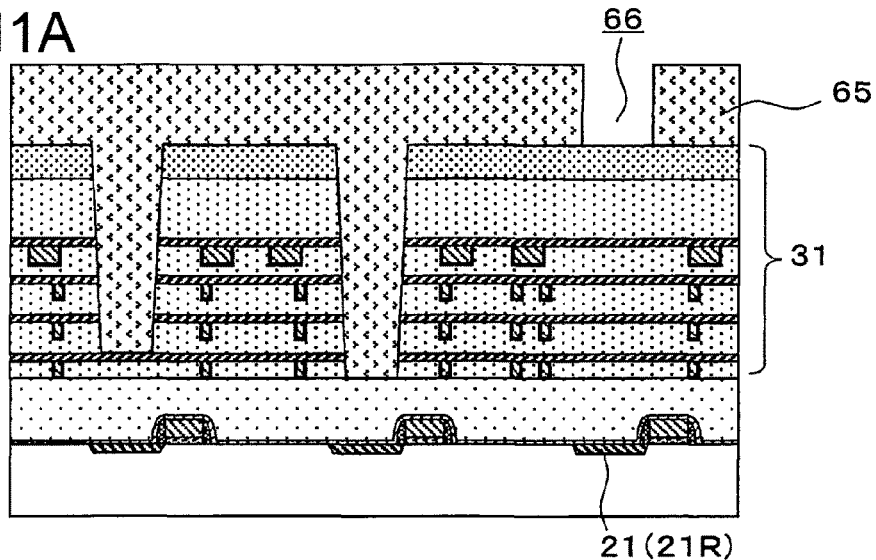
FIG. 11 is a manufacture-process cross-sectional diagram showing the first example of the method of manufacturing the solid-state image pickup apparatus.

Next, as shown in FIG. 11A, on the wiring layer 31, a resist film 65 is formed, and an opening portion 66 is formed (in the light incident direction) above the photoelectric converter 21 (21R) that receives the first color (e.g., red) light by the lithography technique.

Figure 11B:
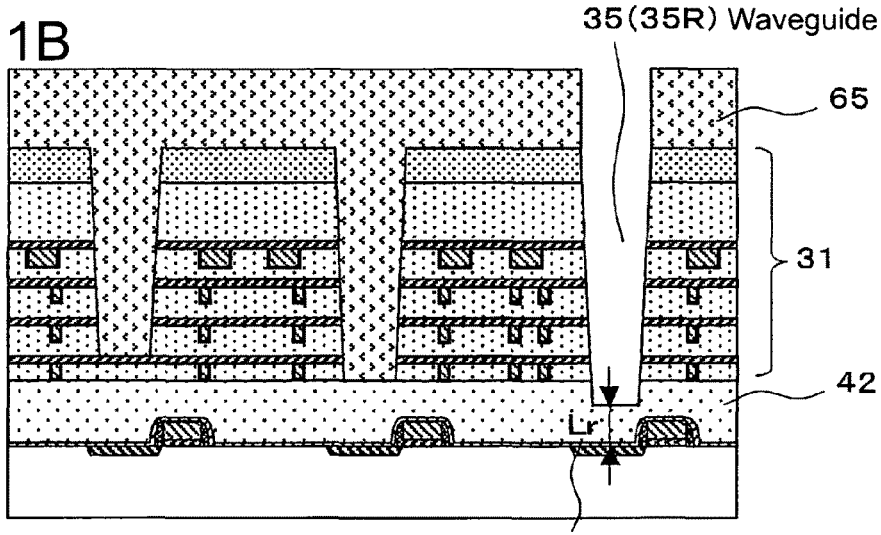
Figure 11C:
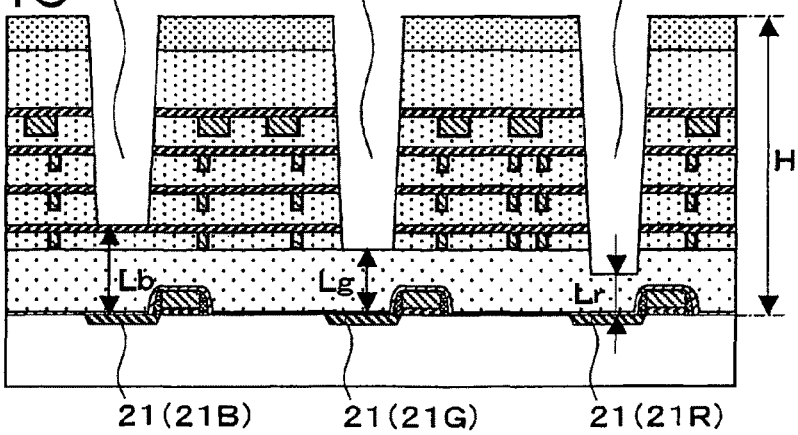

Next, as shown in FIG. 11B, the resist film 65 is used as an etching mask, and the wiring layer 31 and the planarization film 42 are etched, thereby forming the waveguide hole 35 (35R) up to the middle of the planarization film 42, for example. This etching is controlled based on etching time, for example. At this time, the distance Lr from the bottom portion of the waveguide hole 35R to the surface of the photoelectric converter 21 (21R) is set to 580 nm.

After that, the resist film 65 is removed. In the figure, a state immediately before the removal of the resist film 65 is shown.

As a result of the processes described above, as shown in FIG. 11C, the distances Lr, Lg, and Lb from the bottom portions (waveguide exit ends at the time when the waveguides are formed) of the waveguide holes 35 to the surfaces of the photoelectric converters 21 are set depending on the wavelengths of light that enters the waveguide holes 35 (35R, 35G, and 35G). In other words, because the surfaces of the photoelectric converters 21 are flush with the substrate 11, and a height H from the substrate 11 to the entries of the waveguides 14 is constant, a depth D of each of the waveguide holes 35 (35R, 35G, and 35B) is set to a predetermined depth (H-L (Lr, Lg, and Lb)).

After that, although not shown, in the case of forming the solid-state image pickup apparatus 1, the waveguide material 36 is filled in the waveguide holes 35 (35R, 35G, and 35B) and formed on the wiring layer 31. In this way, the waveguides 14 (14R, 14G, and 14B) made of the waveguide material 36 is formed in the waveguide holes 35. Further the planarization film 44 is formed.

Subsequently, on the planarization film 44, at a position corresponding to each of the waveguides 14 (14R, 14G, and 14B), for example, in the light incident direction of the waveguides 14, the color filter 51 corresponding to each color of light guided by the waveguides 14 is formed. Then, the micro lens 52 is formed on the color filter 51. In this way, the solid-state image pickup apparatus 1 is formed.

Further, although not shown, in the case of forming the solid-state image pickup apparatus 2, the waveguide material 36 is filled in the waveguide holes 35 (35R, 35G, and 35B) through the passivation film 37 and formed on the wiring layer 31. In this way, the waveguides 14 (14R, 14G, and 14B) made of the waveguide material 36 is formed in the waveguide holes 35. Further the planarization film 44 is formed.

Subsequently, on the planarization film 44, at a position corresponding to each of the waveguides 14 (14R, 14G, and 14B), for example, in the light incident direction of the waveguides 14, the color filter 51 corresponding to each color of light guided by the waveguides 14 is formed. Then, the micro lens 52 is formed on the color filter 51. In this way, the solid-state image pickup apparatus 2 is formed.

The waveguide material 36 has the refractive index higher than the insulating layer 34, and is a material having a high transmittance of a wavelength in a visible light area, for example. Examples of the material include a silicon nitride film, a diamond film, a composite material film of diamond and an organic-based material, a composite material film of titanium oxide and an organic-based material, and the like.

Thus, in the method of manufacturing the solid-state image pickup apparatus described above, the spectral balance in the difference of the spread angles from the waveguide exit ends 14E of the waveguides 14 due to the wavelengths of colors can be adjusted to be constant. As a result, when signals that are output from the photoelectric converters 21 that receive the red, green, and blue light are synthesized and adjusted to obtain an image of a more natural color, a margin is obtained in the image synthesis, and a color correction can be easily performed, which can provide an advantage of obtaining an image excellent in color reproducing performance.

Further, the solid-state image pickup apparatus has the structure in response to the miniaturization. Therefore, for further miniaturization, by using the structure, it is possible to improve the developing speed of the next-generation solid-state image pickup apparatus and reduce the cost for the development thereof, with the result that the cost reflected to a product can be significantly reduced.

(Second Example of Method of Manufacturing Solid-State Image Pickup Apparatus)

Next, a description will be given on a second example of a method of manufacturing a solid-state image pickup apparatus according to the second embodiment of the present invention with reference to manufacture-process cross-sectional diagrams of FIGS. 12 and 13.

Figure 12A:
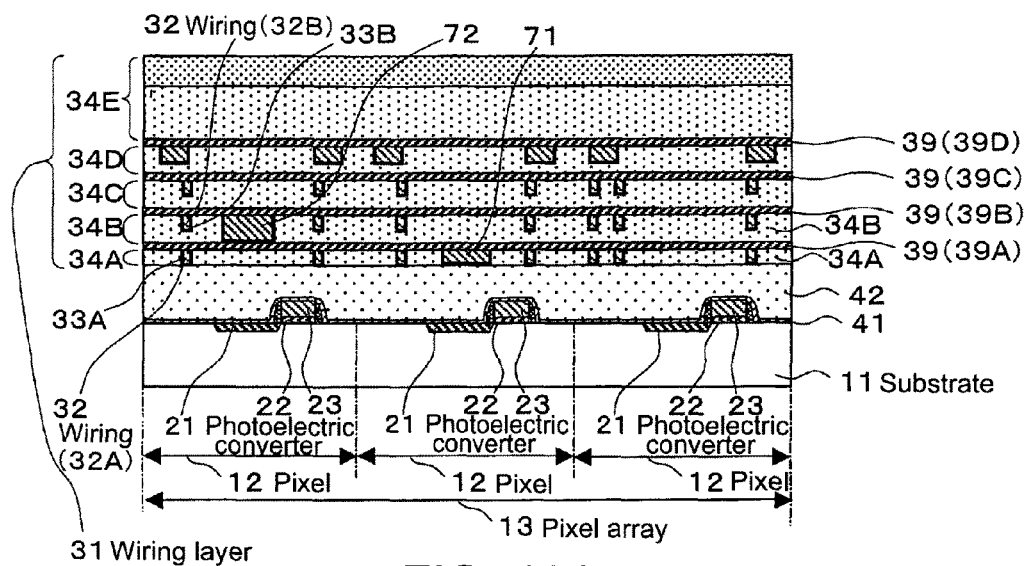
FIG. 12 is a manufacture-process cross-sectional diagram showing a second example of the method of manufacturing the solid-state image pickup apparatus.

As shown in FIG. 12A, on the substrate 11, the pixel array portion 13 constituted of the plurality of pixels 12 each including the photoelectric converter 21 that converts the incident light into an electrical signal is formed. For the substrate 11, a silicon substrate is used as a semiconductor substrate, for example. The photoelectric converter 21 is formed of a photodiode, for example. Further, on the substrate 11, the transfer gate electrode 23 is formed to be adjacent to the photoelectric converter 21 through the gate insulating film 22. In addition, a pixel transistor, a peripheral circuit, and the like (not shown) are also formed.

On the substrate 11, the protection film 41 that covers the photoelectric converter 21, the transfer gate electrode 23, and the like is further formed. On the protection film 41 as an insulating film, the planarization film 42 is formed.

After that, a connection hole (not shown) for electrical connection with the substrate 11, the transfer gate electrode 23, and the like are formed. A metal material such as tungsten (W), copper (Cu), and aluminum (Al) is filled in the connection hole, thereby forming a plug. The plug is formed by forming the metal material that fills the connection holes over an entire surface of the planarization film 42 and then removing an extra metal material by using a chemical mechanical polishing (CMP) method or the like. At this time, the height from the surface of the photoelectric converter 21 to the surface of planarization film 42 is set to be equal to the distance from the waveguide exit end of the waveguide for guiding the green light to the surface of the photoelectric converter 21. For example, in the case where the photoelectric converter 21 is the 1.1 µm☐ cell, the height is set to 690 nm.

After that, the first insulating layer (34) 34A in which the first wiring layer is formed is formed, and then the wiring groove is formed in the first wiring layer 34A. At the same time, a dummy pattern groove that serves as an etching stopper layer used for forming the waveguide hole for the green light is formed.

Next, the barrier metal layer 33A is formed on the inner surface of the wiring groove and the dummy pattern groove. Further, a low-resistive wiring material (e.g., copper (Cu) and aluminum (Al)) embedded in the wiring groove and the dummy pattern groove is formed, and then the extra wiring material and barrier metal layer are removed, to form the first wiring 32 (32A) and a dummy pattern 71. For the removal process, a chemical mechanical polishing is used, for example.

In this way, the first wiring layer 31A is formed.

Subsequently, a diffusion prevention layer 39 (39A) that covers the upper portion of the first wiring 32A is formed on the first insulating layer 34A. The height from the surface of the photoelectric converter 21 to the surface of the diffusion prevention layer 39A is set to be equal to the distance between the waveguide exit end of the waveguide that guides the blue light and the surface of the photoelectric converter 21. For example, in the case where the photoelectric converter 21 is the 1.1 µm☐ cell, the height is set to 840 nm. The diffusion prevention layer 39A serves as the barrier layer for preventing the diffusion of copper (Cu) or the like, and is formed of the insulating film such as a silicon nitride (SiN) film and a silicon carbide (SiC) film.

Next, the second insulating layer 34B is formed. The second insulating layer 34B is formed of a silicon oxide film or a low-dielectric constant material (silicon oxide carbide (SiOC), methylsilsesquioxane (MSQ), hydro-silsesquioxane (HSQ), or the like) film, for example.

Next, by a dual damascene method or the like, the connection hole (not shown) and the wiring groove are formed in the second insulating layer 34B. At the same time, a dummy pattern groove that serves as an etching stopper layer used for forming the waveguide hole for the blue light is formed.

Subsequently, the main wiring material is embedded in the connection hole, the wiring groove, and the dummy pattern groove through the barrier metal layer 33B. Then, the extra main wiring material and barrier metal layer are removed by the chemical mechanical polishing or the like, thereby forming the second wiring 32 (32B) in the wiring groove through the barrier metal layer 33B and forming the plug (not shown) in the connection hole through the barrier metal layer. At the same time, a dummy pattern 72 is formed in the dummy pattern groove.

In this way, the second wiring layer 31B is formed.

Further, on the second wiring layer 31B, a diffusion prevention layer 39B is formed as in the case of the formation on the first wiring layer 31A. The diffusion prevention layer 39B serves as the barrier layer for preventing the diffusion of copper (Cu) or the like, and is formed of an insulating film such as a silicon nitride (SiN) film and a silicon carbide (SiC) film.

Hereinafter, as in the case of the second wiring layer 31B, the third wiring layer 31C, a diffusion prevention layer 39 (39C), the fourth wiring layer 31D, and a diffusion prevention layer 39 (39D) are formed. Further, the insulating layer 34E is formed.

In this way, the wiring layer 31 is formed.

Figure 12B:
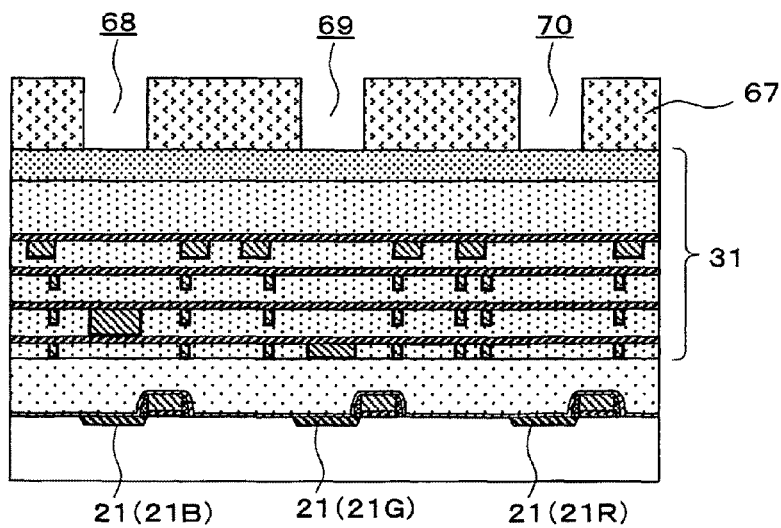

Next, as shown in FIG. 12B, on the wiring layer 31, a resist film 67 is formed, and an opening portion 68 is formed (in the light incident direction) above the photoelectric converter 21 (21B) that receives the third color (e.g., blue) light by the lithography technique. At the same time, in the resist film 67, an opening portion 69 is formed (in the light incident direction) above the photoelectric converter 21 (21G) that receives the second color (e.g., green) light, and an opening portion 70 is formed (in the light incident direction) above the photoelectric converter 21 (21R) that receives the first color (e.g., red) light.

Next, as shown in FIG. 13A, the resist film 67 is used as an etching mask, and the wiring layer 31 is etched. At this time, the etching for forming the waveguide hole 35 (35B) is stopped up to the dummy pattern 71. Further, the etching for forming the waveguide hole 35 (35G) is stopped up to the dummy pattern 72. The etching for forming the waveguide hole 35 (35R) is stopped by time control so that the distance Lr from the bottom portion of the waveguide hole 35R to the surface of the photoelectric converter 21 (21R) is 840 nm, for example.

The etching is performed by dry etching or the like. For example, for the etching of a silicon-based insulating material of the wiring layer 31, a carbon fluoride (CF)-based gas or a fluorohydrocarbon (CHF)-based gas is used, and a compound with silicon having high volatility is formed, thereby performing the etching. Examples of the silicon-based insulating material include a silicon oxide film, a silicon-based low-dielectric constant film (such as SiOC and SiC), and a silicon nitride film. On the other hand, the metal material such as the dummy patterns 71 and 72 is hardly etched by plasma of the CF-based or CHF-based gas. Therefore, the dummy patterns 71 and 72 each function as the etching stopper.

After that, as shown in FIG. 13B, the resist film 67 (see, FIG. 13A) on the wiring layer 31 is removed.

Then, as shown in FIG. 13C, the dummy patterns 71 and 72 (see, FIG. 13C) are removed by an etching.

For the removal of the dummy patterns 71 and 72 each made of the metal material, a wet etching that allows a selective etching of a metal material is used, for example. For example, a case where the dummy patterns 71 and 72 are made of copper (Cu) will be described hereinafter.

Generally, a material that forms a metal wiring is copper (Cu) of a barrier metal and a main wiring. Copper is relatively easily dissolved by the acid. Further, when copper is mixed with hydrogen peroxide water ($H_2O_2$), oxidization of copper is promoted, and the oxidized copper is rapidly etched by the acid. For example, in a case of a mixed solution of a hydrofluoric acid and hydrogen peroxide water, a selection ratio of copper to the silicon oxide film of 100:1 or more is obtained. That is, copper can be etched without giving almost any influence on the material that forms the insulating layer. For the barrier metal layer 33 (see, FIG. 12A), tantalum (Ta)-based material (Ta or TaN) is generally used. The tantalum-based material is hardly etched by a chemical solution that is generally used in a semiconductor process. Therefore, a method of removing the barrier metal layer 33 by a dry etching with an $SF_6$-based gas is used as an example. But, even if the barrier metal layer 33 has a thickness of 10 nm or less and is left in the vicinity of the bottom portion of the waveguide holes 35, there is no problem in guiding of light. That is, even if the barrier metal is left as it is, the waveguides satisfactorily function. Further, titanium (Ti) can also be used for the barrier metal. Titanium is explosively etched with the mixture solution of the hydrofluoric acid and the hydrogen peroxide water as in the case of copper.

In this way, the distances Lr, Lg, and Lb from the bottom portions (waveguide exit ends at the time when the waveguides are formed) of the waveguide holes 35 to the surfaces of the photoelectric converters 21 are set depending on the wavelengths of light that enters the waveguide holes 35 (35R, 35G, and 35G). In other words, because the surfaces of the photoelectric converters 21 are flush with the substrate 11, and the height H from the substrate 11 to the entries of the waveguide holes 35 is constant, the depth D of each of the waveguide holes 35 (35R, 35G, and 35B) is set to the predetermined depth (H-L (Lr, Lg, and Lb)).

After that, although not shown, the same processes as those in the first example only have to be performed.

The waveguide material 36 has the refractive index higher than the insulating layer 34, and is a material having a high transmittance of a wavelength in a visible light area, for example. Examples of the material include a silicon nitride film, a diamond film, a composite material film of diamond and an organic-based material, a composite material film of titanium oxide and an organic-based material, and the like.

Thus, in the method (second example) of manufacturing the solid-state image pickup apparatus described above, the spectral balance in the difference of the spread angles from the waveguide exit ends 14E of the waveguides 14 due to the wavelengths of colors can be adjusted to be constant. As a result, when signals that are output from the photoelectric converters 21 that receive the red, green, and blue light are synthesized and adjusted to obtain an image of a more natural color, a margin is obtained in the image synthesis, and a color correction can be easily performed, which can provide an advantage of obtaining an image excellent in color reproducing performance.

Further, the solid-state image pickup apparatus has the structure in response to the miniaturization. Therefore, for further miniaturization, by using the structure, it is possible to improve the developing speed of the next-generation solid-state image pickup apparatus and reduce the cost for the development thereof, with the result that the cost reflected to a product can be significantly reduced.

(Third Example of Method of Manufacturing Solid-State Image Pickup Apparatus)

Next, a description will be given on a third example of a method of manufacturing a solid-state image pickup apparatus according to the second embodiment of the present invention with reference to manufacture-process cross-sectional diagrams of FIGS. 14 and 15. The third example is different from the second example only in that the diffusion prevention film 39 used in the second example is not formed, and a cobalt tungsten phosphorus (CoWP) layer or a copper-manganese alloy layer is formed as a barrier layer on the upper surface of each of the wirings 32, for example.

Figure 14A:
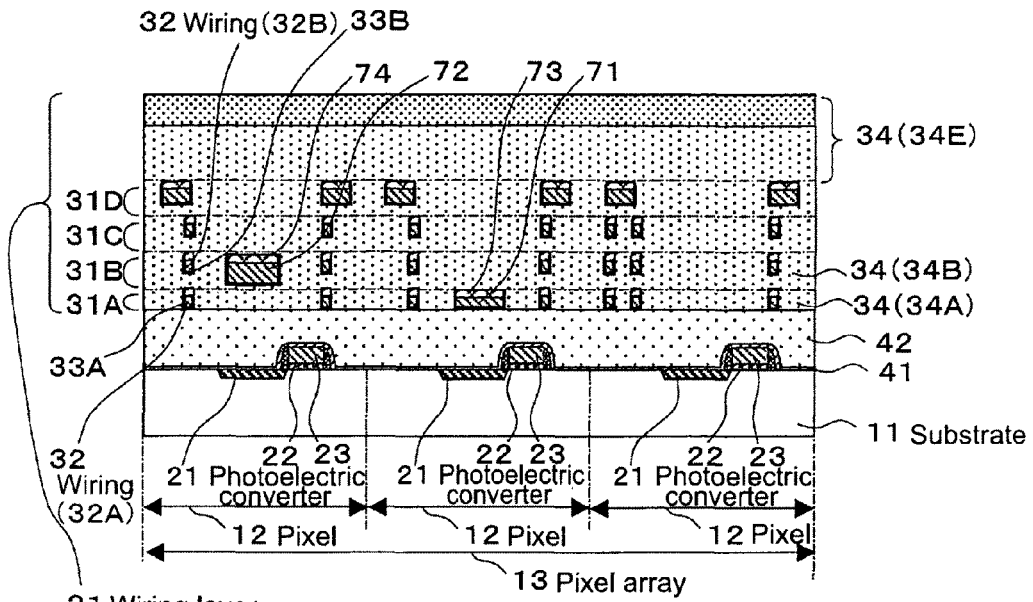
FIG. 14 is a manufacture-process cross-sectional diagram showing a third example of the method of manufacturing the solid-state image pickup apparatus.

As shown in FIG. 14A, on the substrate 11, the pixel array portion 13 constituted of the plurality of pixels 12 each including the photoelectric converter 21 that converts the incident light into an electrical signal is formed as in the second example described above. Further, on the substrate 11, the transfer gate electrode 23 is formed to be adjacent to the photoelectric converter 21 through the gate insulating film 22. In addition, the pixel transistor, the peripheral circuit, and the like (not shown) are also formed.

On the substrate 11, the protection film 41 that covers the photoelectric converter 21, the transfer gate electrode 23, and the like is further formed. On the protection film 41 as an insulating film, the planarization film 42 is formed.

After that, a connection hole (not shown) for electrical connection with the substrate 11, the transfer gate electrode 23, and the like is formed. A metal material such as tungsten (W), copper (Cu), and aluminum (Al) is filled in the connection hole, thereby forming a plug.

The height from the surface of the photoelectric converter 21 to the surface of planarization film 42 after the plug is formed is set to be equal to the distance from the waveguide exit end of the waveguide, which guides the green light, to the surface of the photoelectric converter 21. For example, in the case where the photoelectric converter 21 is the 1.1 µm□ cell, the height is set to 690 nm.

After that, the first insulating layer (34) 34A in which the first wiring layer is formed is formed, and then the wiring groove is formed in the first wiring layer 34A. At the same time, the dummy pattern groove that serves as an etching stopper layer in forming the waveguide hole for the green light is formed.

The height from the surface of the photoelectric converter 21 to the surface of first insulating film 34A is set to be equal to the distance from the waveguide exit end of the waveguide, which guides the blue light, to the surface of the photoelectric converter 21. For example, in the case where the photoelectric converter 21 is the 1.1 µm□ cell, the height is set to 840 nm.

Next, the barrier metal layer 33A is formed on the inner surface of the wiring groove and the dummy pattern groove. Further, the low-resistive wiring material (e.g., copper (Cu)) embedded in the wiring groove and the dummy pattern groove is formed, and then the extra wiring material and barrier metal layer are removed, to form the first wiring (32A) and the dummy pattern 71. For the removal process, a chemical mechanical polishing is used, for example.

After that, for example, a cobalt tungsten phosphorus (CoWP) layer or a copper-manganese alloy layer is formed as a barrier layer 73 on the first wiring 32 (32A) and the dummy pattern 71.

In this way, the first wiring layer 31A is formed.

Next, the second insulating layer 34B is formed. The second insulating layer 34B is formed of a silicon oxide film or a low-dielectric constant material (silicon oxide carbide (SiOC), methylsilsesquioxane (MSQ), hydro-silsesquioxane (HSQ), or the like) film, for example.

Next, by a dual damascene method or the like, the connection hole (not shown) and the wiring groove are formed in the second insulating layer 34B. At the same time, the dummy pattern groove that serves as the etching stopper layer used for forming the waveguide hole for the blue light is formed.

Subsequently, the main wiring material is embedded in the connection hole, the wiring groove, and the dummy pattern groove through the barrier metal layer 33B. Then, the extra main wiring material and barrier metal layer are removed by the chemical mechanical polishing or the like, thereby forming the second wiring 32 (32B) in the wiring groove through the barrier metal layer 33B and forming the plug (not shown) in the connection hole through the barrier metal layer. At the same time, the dummy pattern 72 is formed in the dummy pattern groove.

After that, on the second wiring 32 (32B) and the dummy pattern 72, a cobalt tungsten phosphorus (CoWP) layer or a copper-manganese alloy layer is formed as a barrier layer 74.

In this way, the second wiring layer 31B is formed.

Hereinafter, as in the case of the second wiring layer 31B, the third wiring layer 31C and the fourth wiring layer 31D are formed. Further, the insulating layer 34E is formed.

In this way, the wiring layer 31 is formed.

Figure 14B:
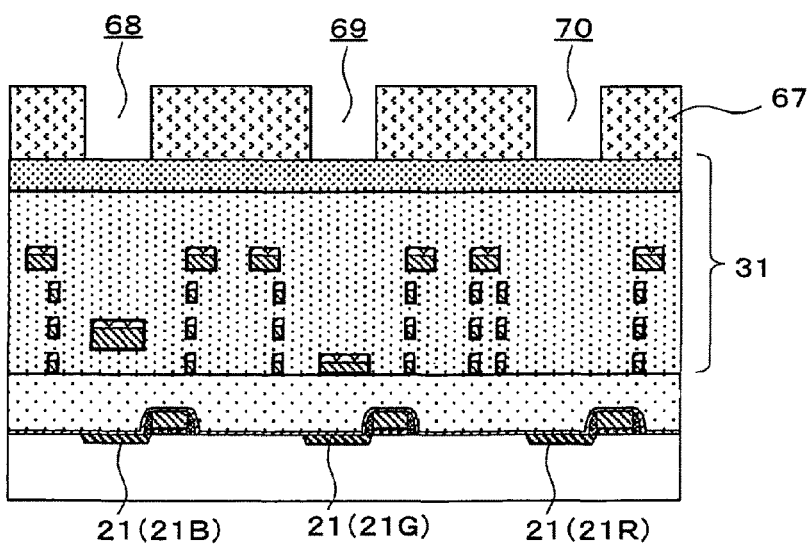

Next, as shown in FIG. 14B, on the wiring layer 31, the resist film 67 is formed, and the opening portion 68 is formed (in the light incident direction) above the photoelectric converter 21 (21B) that receives the third color (e.g., blue) light by the lithography technique. At the same time, in the resist film 67, the opening portion 69 is formed (in the light incident direction) above the photoelectric converter 21 (21G) that receives the second color (e.g., green) light, and the opening portion 70 is formed (in the light incident direction) above the photoelectric converter 21 (21R) that receives the first color (e.g., red) light.

Figure 15A:
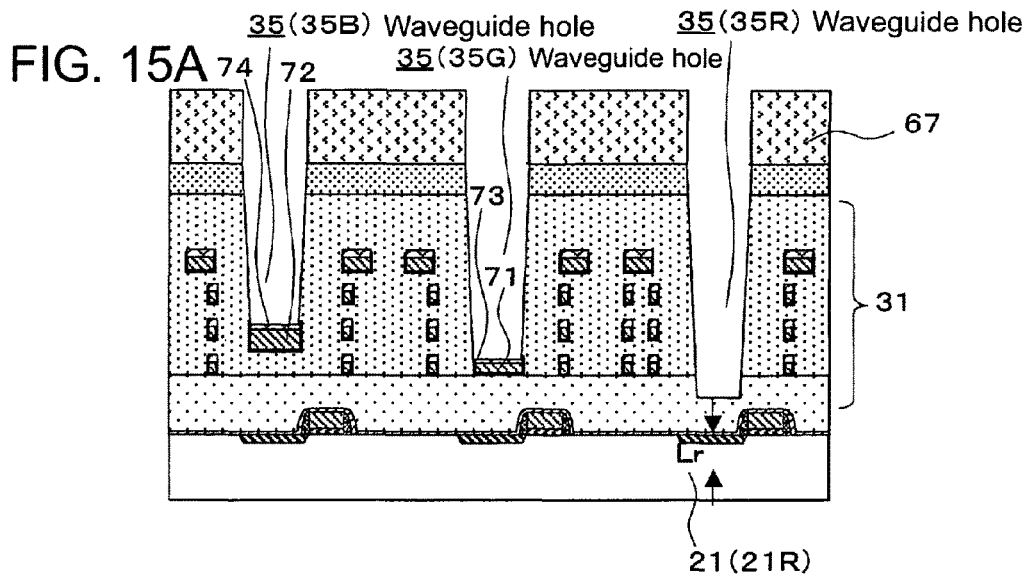
FIG. 15 is a manufacture-process cross-sectional diagram showing the third example of the method of manufacturing the solid-state image pickup apparatus.

Next, as shown in FIG. 15A, the resist film 67 is used as an etching mask, and the wiring layer 31 is etched. At this time, the etching for forming the waveguide hole 35 (35B) is stopped up to the barrier layer 73 of the dummy pattern 71. Further, the etching for forming the waveguide hole 35 (35G) is stopped up to the barrier layer 74 of the dummy pattern 72. The etching for forming the waveguide hole (35R) is stopped by time control so that the distance Lr from the bottom portion of the waveguide hole 35R to the surface of the photoelectric converter 21 (21R) is 840 nm, for example.

Figure 15B:
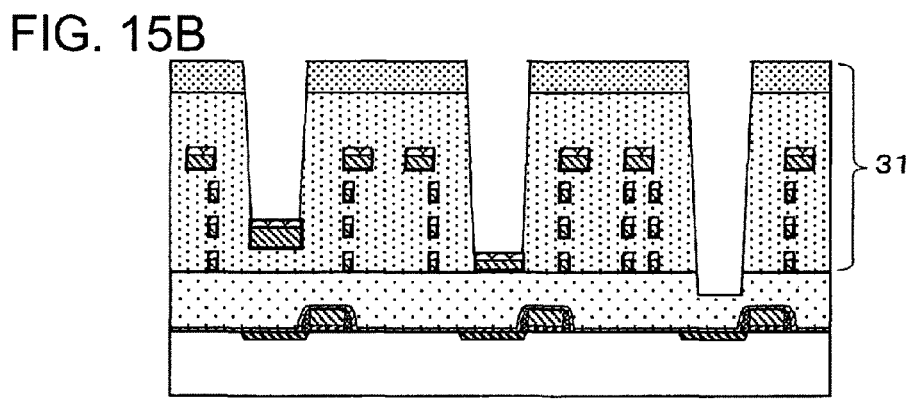

After that, as shown in FIG. 15B, the resist film 67 (see, FIG. 15A) on the wiring layer 31 is removed.

Figure 15C:
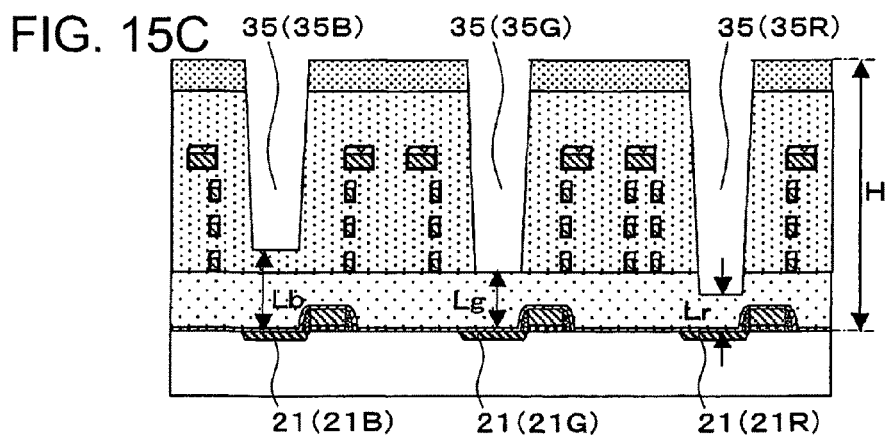

Then, as shown in FIG. 15C, the dummy patterns 71 and 72 and barrier layers 73 and 74 (see, FIG. 15A) are removed by an etching.

For the removal of the dummy patterns 71 and 72 each made of the metal material, a wet etching that allows a selective etching of a metal material is used, for example.

In this way, the distances Lr, Lg, and Lb from the bottom portions (waveguide exit ends at the time when the waveguides are formed) of the waveguide holes 35 to the surfaces of the photoelectric converters 21 are set depending on the wavelengths of light that enters the waveguide holes 35 (35R, 35G, and 35G). In other words, because the surfaces of the photoelectric converters 21 are flush with the substrate 11, and the height H from the substrate 11 to the entries of the waveguide holes 35 is constant, the depth D of each of the waveguide holes 35 (35R, 35G, and 35B) is set to the predetermined depth (H-L (Lr, Lg, and Lb)).

After that, although not shown, the same processes as those in the first example only have to be performed.

Here, a description will be given on a method of forming the barrier layer 73 formed on the upper surfaces of the wirings 32 and the upper surface of the dummy patterns 71 and 72.

The upper surfaces of the wirings 32 and the dummy patterns 71 and 72 are the copper wirings.

For the formation of a selective barrier metal on the upper portion of the copper wiring, cobalt tungsten phosphorus (CoWP), cobalt tungsten boron (CoWB), or the like by electroless plating is used.

A process of forming the selective barrier metal is introduced after the chemical mechanical polishing of the extra barrier metal and copper to form the copper wiring. The process is significantly easy. A catalyst such as palladium (Pd) is given (this process may be omitted), and thereafter the electroless plating is just performed. The electroless plating is formed by giving or taking electrons. Therefore, a growth can be obtained not on the insulating material such as the silicon oxide film but on the metal portion such as copper. Accordingly, a selective growth only on the upper portion of the copper wiring can be obtained. A barrier metal formed of CoWP, CoWB, or the like inherently has an effect of diffusion prevention of copper or the like, and thus the silicon nitride (SiN) film, the silicon carbide (SiC) film, or the like is not required unlike the first and second examples described above.

As a result, in the method of manufacturing the solid-state image pickup apparatus described above, the spectral balance in the difference of the spread angles from the waveguide exit ends 14E of the waveguides 14 due to the wavelengths of colors can be adjusted to be constant. As a result, when signals that are output from the photoelectric converters 21 that receive the red, green, and blue light are synthesized and adjusted to obtain an image of a more natural color, a margin is obtained in the image synthesis, and a color correction can be easily performed, which can provide an advantage of obtaining an image excellent in color reproducing performance.

Further, the solid-state image pickup apparatus has the structure in response to the miniaturization. Therefore, for further miniaturization, by using the structure, it is possible to improve the developing speed of the next-generation solid-state image pickup apparatus and reduce the cost for the development thereof, with the result that the cost reflected to a product can be significantly reduced.

Furthermore, the third example provides two significant advantages.

First, SiN and SiC having a relatively large refractive index are not used. Therefore, light that enters the waveguide is prevented from leaking, which increases the amount of light that reaches the photodiode. As a result, the sensitivity can be increased.

Second, the function of the etching stopper is advantageous. The surface of the etching stopper of the second example is formed of copper (Cu), which relatively easily corrodes away. In contrast, the cobalt-based material is relatively unlikely to corrode. Thus, a margin can be obtained during exposure with plasma.

3. Third Embodiment (Example of Structure of Image Pickup Apparatus)

A description will be given on an example of a structure of an image pickup apparatus according to a third embodiment of the present invention with reference to a block diagram of FIG. 16. In the image pickup apparatus, the solid-state image pickup apparatus according to the embodiments of the present invention is used.

Figure 16:
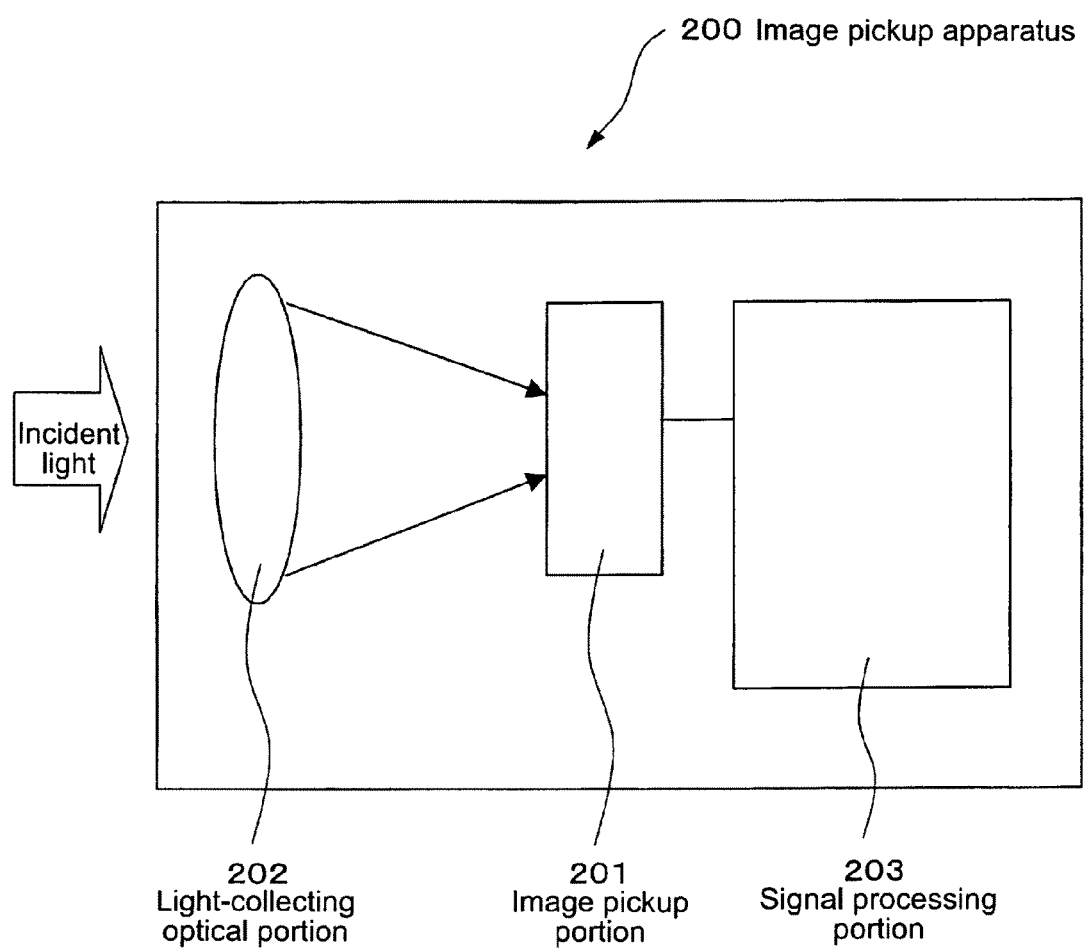
FIG. 16 is a block diagram showing an example of an image pickup apparatus according to a third embodiment of the present invention.

As shown in FIG. 16, an image pickup apparatus 200 includes a solid-state image pickup apparatus (not shown) in an image pickup portion 201. On a light-collecting side of the image pickup portion 201, a light-collecting optical portion 202 that forms an image is provided. Further, to the image pickup portion 201, connected is a signal processing portion 203 having a drive circuit that drives the image pickup portion 201 and a signal processing circuit that performs an image processing on a signal that has been subjected to the photoelectric conversion in the solid-state image pickup apparatus. In addition, an image signal that has been subjected to the processing in the signal processing portion 203 can be stored in an image storage portion (not shown). In the image pickup apparatus 200, the solid-state image pickup apparatus 1 or 2 described in the above embodiments can be used for the solid-state image pickup apparatus.

The image pickup apparatus 200 of the present invention uses the solid-state image pickup apparatus 1 or 2 according to the embodiments of the present invention, so the spectral balance in the solid-state image pickup apparatuses 1 and 2 can be adjusted. Therefore, an image synthesis margin can be obtained in making an adjustment for an image of a more natural color, and a color correction can be easily performed, with the result that the advantage of obtaining an image excellent in color reproducing performance can be provided.

In addition, the image pickup apparatus 200 may have a one-chip form or a module-like form in which an image pickup function in which the image pickup portion and the signal processing portion or the optical system are collectively packaged is implemented. In addition, the solid-state image pickup apparatuses 1 and 2 according to the present invention can also be applied to an image pickup apparatus as described above. Here, the image pickup apparatus refers to a mobile apparatus having a camera, an image pickup function, or the like. Further, the meaning of "picking up an image" broadly includes fingerprint detection, in addition to picking up an image at a time of general shooting with a camera.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus, comprising:
    a substrate provided with a pixel array portion constituted of a plurality of pixels each having a photoelectric converter, the photoelectric converter converting incident light into an electrical signal;
    a wiring layer including a plurality of wirings and an insulating layer that covers the plurality of wirings, the plurality of wirings being laminated above the substrate; and
    a waveguide to guide light to each of the photoelectric converters of the plurality of pixels, the waveguide being formed in the wiring layer, the waveguide being formed to have a waveguide exit end from which light exits the waveguide so that a distance between the waveguide exit end and a surface of the photoelectric converter that receives light from the waveguide become shorter, as wavelengths of light guided by the waveguide are longer,
    wherein the photoelectric converters are located at the same, or substantially the same, depth within the substrate, and the distance between the waveguide exit end and the surface of the photoelectric converter that receives light from the waveguide becomes shorter by varying the location of the exit end and not the depth of the photoelectric converter that receives light from the waveguide,
    wherein the distance between the waveguide exit end and the surface of the photoelectric converter is determined based on an equation, $wf=\lambda L/\pi W$, where L is the distance between the waveguide exit end and the surface of the photoelectric converter, wf is a radius of the waveguide exit end, $\lambda$ is a wavelength of the light guided by the waveguide, and W is a radius of a spot formed on the surface of the photoelectric converter.

2. The solid-state image pickup apparatus according to claim 1,
    wherein the waveguide includes waveguides for pixels of a first color, a second color, and a third color, the first color, the second color, and the third color having shorter wavelengths in the stated order, and
    wherein the distance between the waveguide exit end of the waveguide for the pixel of the first color and the surface of the photoelectric converter is set to be shorter than that between the waveguide exit end of the waveguide for the pixel of the second color and the surface of the photoelectric converter, and the distance between the waveguide exit end of the waveguide for the pixel of the second color and the surface of the photoelectric converter is set to be shorter than that between the waveguide exit end of the waveguide for the pixel of the third color and the surface of the photoelectric converter.

3. The solid-state image pickup apparatus according to claim 1,
    wherein the waveguide includes a red-pixel waveguide, a green-pixel waveguide, and a blue-pixel waveguide, and
    wherein the distance between the waveguide exit end of the red-pixel waveguide and the surface of the photoelectric converter is set to be shorter than that between the waveguide exit end of the green-pixel waveguide and the surface of the photoelectric converter, and the distance between the waveguide exit end of the green-pixel waveguide and the surface of the photoelectric converter is set to be shorter than that between the waveguide exit end of the blue-pixel waveguide and the surface of the photoelectric converter.

4. The solid-state image pickup apparatus according to claim 1,
    wherein the wavelength of light guided by each of the waveguides is inversely proportional to the distance between the waveguide exit end and the surface of the photoelectric converter.

5. The solid-state image pickup apparatus according to claim 1, further comprising:
    a micro lens to guide incident light to a light incident side of each of the waveguides through a color filter.

6. A solid-state image pickup apparatus, comprising:
    a substrate provided with a pixel array portion constituted of a plurality of pixels having photoelectric converters, the photoelectric converters converting incident light into an electrical signal and having the same height;
    a wiring layer including a plurality of wirings and an insulating layer that covers the plurality of wirings, the plurality of wirings being laminated above the substrate; and
    a waveguide to guide light to each of the photoelectric converter of the plurality of pixels, the waveguide being formed in the wiring layer, the waveguide including a plurality of waveguides whose light incident ends have the same height and whose depths are set to be shorter as wavelengths of light guided by the plurality of waveguides are longer,
    wherein the photoelectric converters are located at the same, or substantially the same, depth within the substrate, and the distances between exit ends of the waveguides and respective surfaces of the photoelectric converters becomes shorter by varying the depth of the exit ends from waveguide-to-waveguide and not varying the depth of the photoelectric converters, wherein the distance between the waveguide exit end and the surface of the photoelectric converter is determined based on an equation, $wf=\lambda L/\pi W$, where L is the distance between the waveguide exit end and the surface of the photoelectric converter, wf is a radius of the waveguide exit end, $\lambda$ is a wavelength of the light guided by the waveguide, and W is a radius of a spot formed on the surface of the photoelectric converter.

7. An image pickup apparatus, comprising:
a light-collecting optical portion to collect incident light;
a solid-state image pickup apparatus to receive light collected by the light-collecting optical portion and perform photoelectric conversion; and
a signal processing portion to process a signal obtained by the photoelectric conversion,
wherein the solid-state image pickup apparatus includes a substrate provided with a pixel array portion constituted of a plurality of pixels each having a photoelectric converter that converts incident light into an electrical signal, a wiring layer including a plurality of wirings and an insulating layer that covers the plurality of wirings that are laminated above the substrate, and a waveguide to guide light to each of the photoelectric converters of the plurality of pixels, the waveguide being formed in the wiring layer, the waveguide being formed to have a waveguide exit end from which light exits the waveguide so that a distance between the waveguide exit end and a surface of the photoelectric converter that receives light from the waveguide become shorter, as wavelengths of light guided by the waveguide are longer,
wherein the photoelectric converters are located at the same, or substantially the same, depth within the substrate, and the distance between the waveguide exit end and the surface of the photoelectric converter that receives light from the waveguide becomes shorter by varying the location of the exit end and not the depth of the photoelectric converter that receives light from the waveguide,
wherein the distance between the waveguide exit end and the surface of the photoelectric converter is determined based on an equation, $wf=\lambda L/\pi W$, where L is the distance between the waveguide exit end and the surface of the photoelectric converter, wf is a radius of the waveguide exit end, $\lambda$ is a wavelength of the light guided by the waveguide, and W is a radius of a spot formed on the surface of the photoelectric converter.

* * * * *